(12) United States Patent
Breinlinger et al.

(10) Patent No.: US 7,960,989 B2
(45) Date of Patent: Jun. 14, 2011

(54) MECHANICAL DECOUPLING OF A PROBE CARD ASSEMBLY TO IMPROVE THERMAL RESPONSE

(75) Inventors: Keith J. Breinlinger, San Ramon, CA (US); Eric D. Hobbs, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 77 days.

(21) Appl. No.: 12/478,117

(22) Filed: Jun. 4, 2009

(65) Prior Publication Data

US 2010/0134127 A1  Jun. 3, 2010

Related U.S. Application Data

(63) Continuation-in-part of application No. 12/327,643, filed on Dec. 3, 2008, now Pat. No. 7,772,863.

(51) Int. Cl.
*G01R 31/20* (2006.01)
*G01R 31/02* (2006.01)

(52) U.S. Cl. ............... 324/754.11; 324/762.01
(58) Field of Classification Search ............... 324/158.1, 324/754–765

See application file for complete search history.

(56) References Cited

U.S. PATENT DOCUMENTS

| | | | |
|---|---|---|---|
| 3,691,506 A | 9/1972 | Bender | |
| 4,330,163 A | 5/1982 | Aikens et al. | |
| 4,715,682 A | 12/1987 | Koek et al. | |
| 4,779,463 A | 10/1988 | Woodruff | |
| 5,422,574 A | 6/1995 | Kister | |
| 5,806,181 A | 9/1998 | Khandros et al. | |
| 6,359,452 B1 * | 3/2002 | Mozzetta | 324/754 |
| 6,429,029 B1 | 8/2002 | Eldridge et al. | |
| 6,509,751 B1 * | 1/2003 | Mathieu et al. | 324/754 |
| 6,533,606 B2 | 3/2003 | Yamane | |
| 6,538,799 B2 | 3/2003 | McClelland | |
| 6,640,415 B2 | 11/2003 | Eslamy et al. | |
| 6,669,489 B1 | 12/2003 | Dozier, II | |
| 6,683,787 B1 | 1/2004 | Banton et al. | |
| 6,690,185 B1 | 2/2004 | Khandros et al. | |
| 6,722,905 B2 | 4/2004 | Negishi et al. | |
| 6,972,578 B2 | 12/2005 | Martens et al. | |
| 6,999,317 B2 | 2/2006 | Chengalva et al. | |
| 7,002,363 B2 | 2/2006 | Mathieu | |

(Continued)

FOREIGN PATENT DOCUMENTS

KR  10-2008-009996  11/2008

OTHER PUBLICATIONS

U.S. Appl. No. 12/327,576, filed Dec. 3, 2008, Hobbs.

(Continued)

*Primary Examiner* — Ha Tran T Nguyen
*Assistant Examiner* — Joshua Benitez
(74) *Attorney, Agent, or Firm* — Kirton & McConkie

(57) ABSTRACT

A stiffener structure, a wiring substrate, and a frame having a major surface disposed in a stack can be part of a probe card assembly. The wiring substrate can be disposed between the frame and the stiffener structure, and probe substrates can be coupled to the frame by one or more non-adjustably fixed coupling mechanisms. Each of the probe substrates can have probes that are electrically connected through the probe card assembly to an electrical interface on the wiring substrate to a test controller. The non-adjustably fixed coupling mechanisms can be simultaneously stiff in a first direction perpendicular to the major surface and flexible in a second direction generally parallel to the major surface.

19 Claims, 28 Drawing Sheets

U.S. PATENT DOCUMENTS

| | | |
|---|---|---|
| 7,064,566 B2 | 6/2006 | Khandros et al. |
| 7,071,714 B2 | 7/2006 | Eldridge et al. |
| 7,075,319 B2 * | 7/2006 | Mori .................. 324/754 |
| 7,129,730 B2 * | 10/2006 | Liu et al. ............ 324/758 |
| 7,180,321 B2 * | 2/2007 | Behziz et al. ....... 324/765 |
| 7,217,580 B2 | 5/2007 | Ondricek et al. |
| 7,230,437 B2 | 6/2007 | Eldridge et al. |
| 7,262,611 B2 * | 8/2007 | Mathieu et al. ..... 324/754 |
| 7,285,968 B2 | 10/2007 | Eldridge et al. |
| 7,349,223 B2 | 3/2008 | Haemer et al. |
| 7,368,930 B2 * | 5/2008 | Hobbs et al. ........ 324/758 |
| 7,404,236 B2 | 7/2008 | Cho et al. |
| 7,419,313 B2 | 9/2008 | Jablonski et al. |
| 7,471,078 B2 * | 12/2008 | Hobbs et al. ........ 324/158.1 |
| 7,471,094 B2 | 12/2008 | Hobbs et al. |
| 7,622,935 B2 * | 11/2009 | Hobbs et al. ........ 324/754 |
| 7,671,614 B2 * | 3/2010 | Eldridge et al. ..... 324/758 |
| 7,688,063 B2 * | 3/2010 | McFarland et al. .. 324/158.1 |
| 7,746,089 B2 * | 6/2010 | Hobbs et al. ........ 324/754 |
| 7,772,863 B2 * | 8/2010 | Breinlinger et al. . 324/760 |
| 2003/0085721 A1 * | 5/2003 | Eldridge et al. ..... 324/754 |
| 2005/0205282 A1 | 9/2005 | Toyoda et al. |
| 2006/0290367 A1 * | 12/2006 | Hobbs et al. ........ 324/763 |
| 2008/0042668 A1 | 2/2008 | Eldridge et al. |
| 2008/0157791 A1 | 7/2008 | Hobbs et al. |
| 2008/0211525 A1 | 9/2008 | Garabedian et al. |
| 2008/0231258 A1 | 9/2008 | Hobbs et al. |
| 2010/0039133 A1 | 2/2010 | McFarland et al. |
| 2010/0134128 A1 | 6/2010 | Hobbs |

OTHER PUBLICATIONS

U.S. Appl. No. 12/327,643, filed Dec. 3, 2008, Breinlinger et al.
PCT/US2009/065426: International Search Report and Written Opinion of the International Searching Authority (Jun. 14, 2010), 13 pages.

* cited by examiner

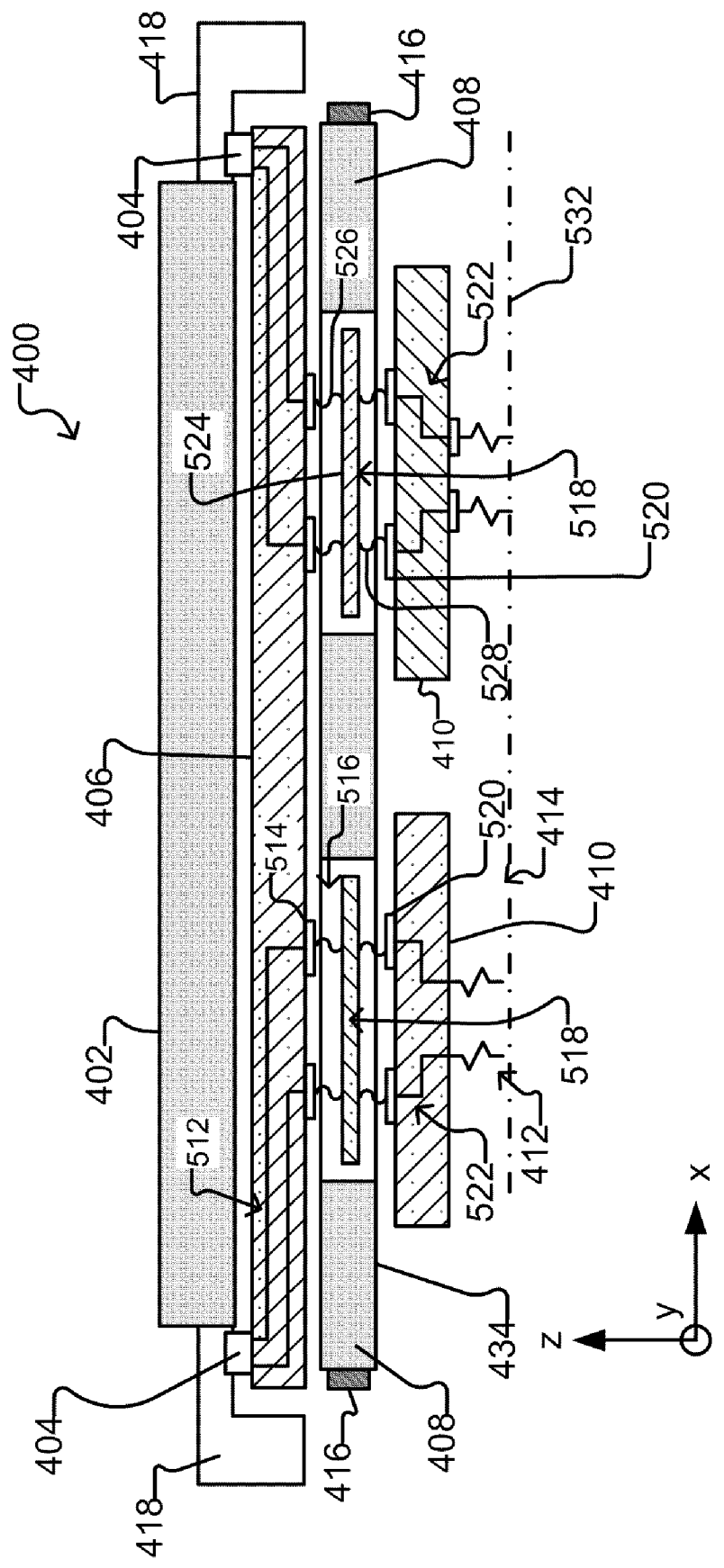

MECHANICAL DECOUPLING OF A PROBE CARD ASSEMBLY TO IMPROVE THERMAL RESPONSE

CROSS-REFERENCE TO RELATED APPLICATION(S)

This application is a continuation-in-part of U.S. patent application Ser. No. 12/327,643, filed Dec. 3, 2008 (pending).

BACKGROUND

FIG. 1 illustrates a prior art test system 100 for testing electronic devices. A test controller 102 can provide input signals to the DUTs 118 and can receive response signals generated by the DUTs 118 in response to the input signals. The term "test signals" can refer generically to either or both the input signals generated by the test controller 102 and the response signals generated by the DUTs 118. The test system 100 can include a probe card assembly 112. Electrically conductive probes 114 of the probe card assembly 112 can make pressure-based electrical connections with terminals 116 of the DUTs 118, and the test signals can be passed between the test controller 102 and the DUTs 118 through a connection 104 (e.g., a coaxial cable, a wireless link, a fiber optic link, etc.), electronics (not shown) in a test head 106, connectors 108 between the test head 106 the probe card assembly 112, and the probe card assembly 112. The probe card assembly 112 can be coupled to a mounting surface 110 of a housing 120 (e.g., a prober) that includes a moveable chuck 122 on which the DUTs 118 are disposed. The chuck 122 can move the DUTs 118 such that terminals 116 of the DUTs 118 are pressed against probes 114 of the probe card assembly 112. Alternatively or in addition, the probe card assembly 112 can be moved.

As shown in FIG. 2, the probe card assembly 112 can include multiple substrates. For example, the probe card assembly 112 in FIG. 1 includes a wiring substrate 202 and a probe substrate 206, which typically are made of different materials and thus have different coefficients of thermal expansion (CTE). Temperature changes or gradients can thus cause the different substrates to expand or contract different amounts. Because the wiring substrate 202 and the probe substrate 206 are coupled together in the probe card assembly 112 in FIG. 2, this can cause the wiring substrate 202 and the probe substrate 206 to warp as shown in FIG. 3. Warping can also be opposite of that shown in FIG. 3. As shown in FIGS. 2 and 3, such warping can change an orientation of the tips of the probes 412. For example, an initial orientation 208 of the tips of the probes 412 can change to a warped orientation 208'. Thermal expansion or contraction of the substrates (e.g., the wiring substrate 202 and the probe substrate 206) of the probe card assembly 112 can cause other problems. For example, electrical connections between the substrates can become misaligned. In the probe card assembly 112 of FIG. 2, for example, electrical connections (not shown) between the wiring substrate 202 and the probe substrate 206 can become misaligned. As another example, the probes 412 can become misaligned with the terminals 116 of the DUTs 118 (see FIG. 1). Some embodiments address one or more of the foregoing problems and/or other problems as described herein.

SUMMARY

In some embodiments, a probe card assembly for testing electronic devices can comprise a stiffener structure, a wiring substrate, and a frame having a major surface disposed in a stack. The wiring substrate can be disposed between the frame and the stiffener structure. The probe card assembly can also include a plurality of probe substrates each having probes that are electrically connected through the probe card assembly to an electrical interface on the wiring substrate to a test controller. One or more non-adjustably fixed coupling mechanisms can fix one or more of the probe substrates to the frame. The non-adjustably fixed coupling mechanisms can be simultaneously stiff in a first direction perpendicular to the major surface and flexible in a second direction generally parallel to the major surface.

In some embodiments, a process of testing semiconductor dies can include coupling a probe card assembly to a test system. The probe card assembly can comprise a frame coupled to a stiffener structure, a wiring substrate disposed between the stiffener structure and the frame, and a plurality of probe substrates coupled to a major surface of the frame. The process can also include electrically connecting an electrical interface on the wiring substrate to a test controller configured to control testing of the dies. The electrical interface electrically can be connected through the probe card assembly to probes coupled to the probe substrates. The process can also include effecting contact between tips of some or all of the probes and terminals of the dies. While maintaining the contact, test signals can be provided between the test controller and the dies through the probe card assembly. While providing the test signals, relative movement between the frame and each of the probe substrates can be impeded in a first direction perpendicular to the major surface of the frame. Relative movement between the frame and each of the probe substrates in a second direction generally parallel to the major surface of the frame can be simultaneously allowed.

In some embodiments, a process of making a probe card assembly can include obtaining a stack, which can include a stiffener structure, a frame coupled to the stiffener structure, and a wiring substrate between the stiffener structure and the frame. The wiring substrate can be coupled to the frame. The process can also include coupling probe substrates to the frame with non-adjustably fixed coupling mechanisms that are simultaneously stiff in a first direction that is perpendicular to the stack and flexible in second directions that are parallel to the stack. The probes coupled to the probe substrates can be electrically connected through the frame and wiring substrate to an electrical interface on the wiring substrate to a test controller.

BRIEF DESCRIPTION OF THE DRAWINGS

FIG. 6A shows the side, cross-sectional view of FIG. 5 with only the electrical connections for ease of illustration.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on or attached to or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In some figures, "x," "y," and "z" axes are provided in accordance with a right-hand coordinate system for ease of discussion and illustration but not by way of limitation. In addition, where reference is made to a list of elements (e.g., elements a, b, c), such reference is intended to include any one of the listed elements by itself, any combination of less than all of the listed elements, and/or a combination of all of the listed elements.

Figure 4:
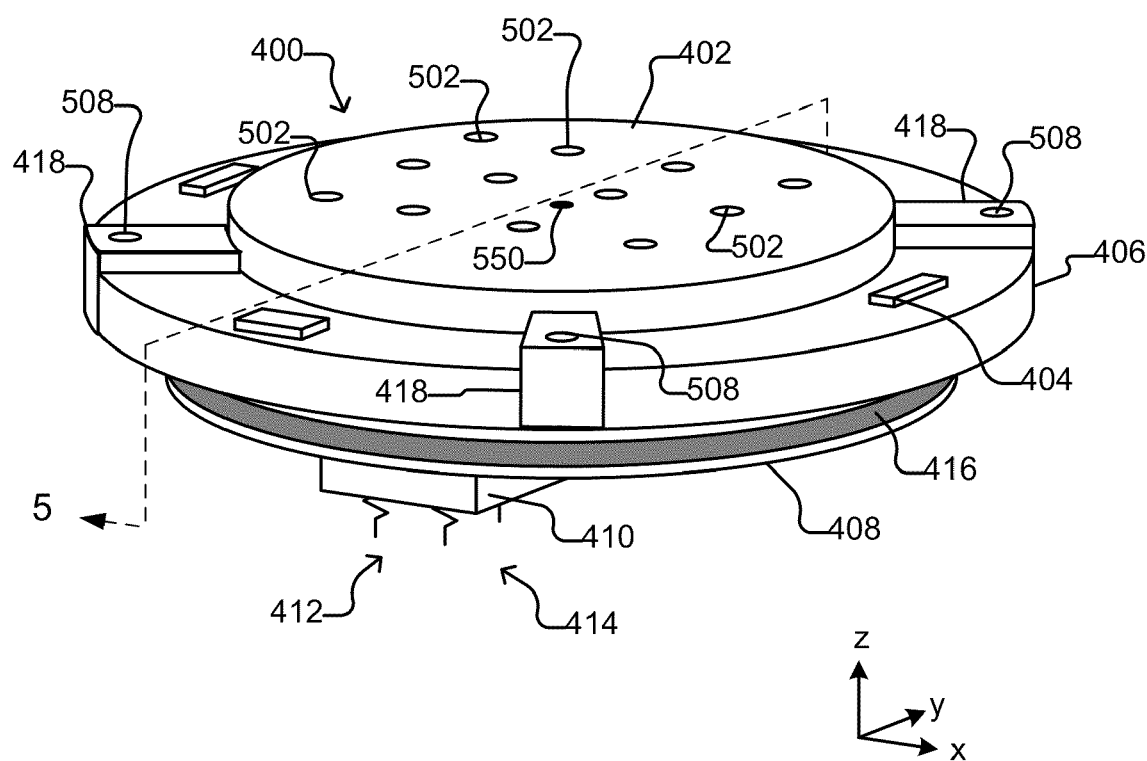
FIG. 4 illustrates a perspective view of a probe card assembly according to some embodiments of the invention.
Figure 5:
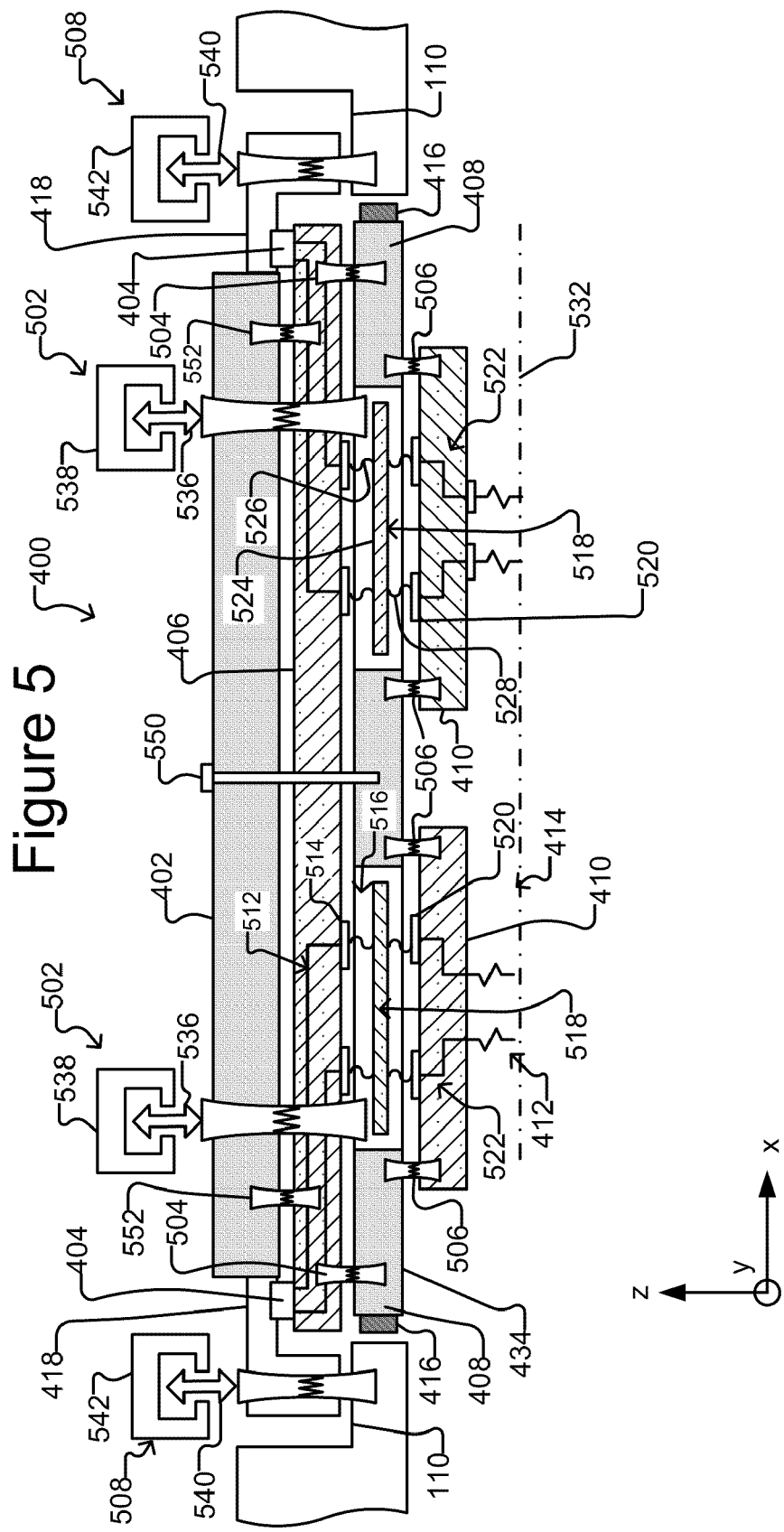
FIG. 5 shows a side, cross-sectional view of the probe card assembly of FIG. 4 with simplified diagrams of electrical connections and mechanical coupling.
Figure 6B:
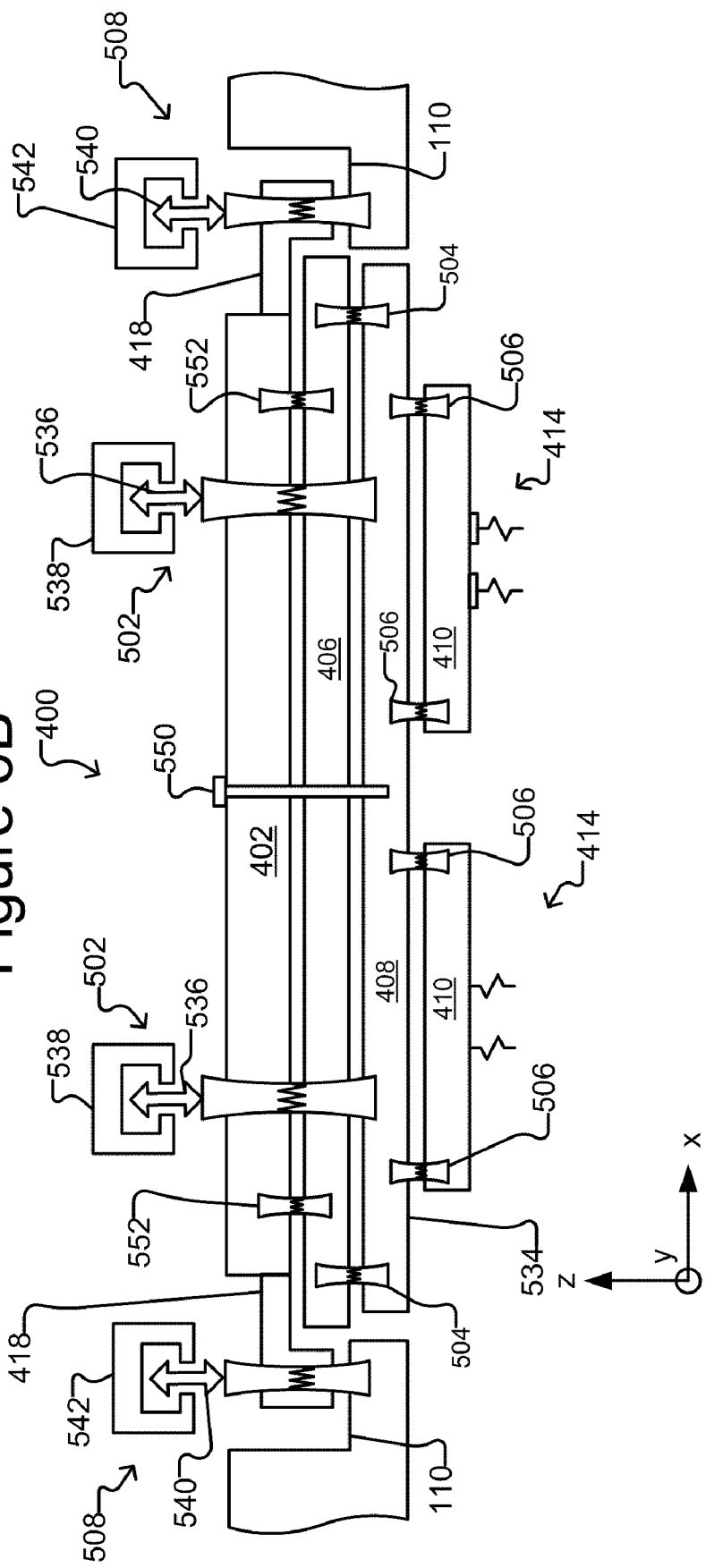
FIG. 6B shows the side, cross-sectional view of FIG. 5 with only the mechanical coupling for ease of illustration.

FIGS. 4, 5, 6A, and 6B illustrate an embodiment of a probe card assembly 400 according to some embodiments of the invention. FIG. 4 illustrates a perspective view of the probe card assembly 400, and FIG. 5 shows a side, cross-sectional view of the probe card assembly of FIG. 4. FIG. 5 includes simplified diagrams of electrical connections and mechanical coupling of the probe card assembly 400. FIG. 6A shows the side, cross-sectional view of FIG. 5 with the electrical connections but without the mechanical coupling. This is for ease of illustration of the electrical connections. FIG. 6B shows the side, cross-sectional view of FIG. 5 with the mechanical coupling but without the electrical connections. This is for ease of illustration of the mechanical coupling. It is to be understood, however, that the probe card assembly 400 can include both the electrical connections and the mechanical coupling.

As shown, the probe card assembly 400 can include a stiffener 402, a wiring substrate 406, a frame 408 (which can be another stiffener), and one or more probe assemblies 414 each comprising a probe substrate 410 and probes 412. The probe card assembly 400 can be coupled to the mounting surface 110 of the housing 120 in place of the probe card assembly 112 in the test system 100 of FIG. 1.

With reference to FIGS. 5 and 6A, electrical connections within the probe card assembly 400 will now be discussed. As shown, electrical connectors 404 (e.g., zero-insertion-force electrical connectors, pogo pin pads, etc.) can be disposed on the wiring substrate 406 (e.g., a semi-rigid substrate such as a multi-layer printed circuit board or other type of wiring substrate). The electrical connectors 404 can be connected to connectors 108 to the test head 106 in the test system 100 of FIG. 1. Electrical connectors 404 in FIGS. 5 and 6A can thus be an electrical interface to a test controller (e.g., test controller 102 in FIG. 1).

Multiple individual electrical paths can be provided between the connectors 404 and the probes 412. For example, electrically conductive connections 512 (e.g., electrically conductive vias and/or traces) on or within the wiring substrate 406 connect the connectors 404 with terminals 514 on the wiring substrate 406 as shown in FIGS. 5 and 6A. Electrical connections can be provided between the terminals 514 on the wiring substrate 406 and the terminals 520 on the probe substrates 414. Flex connectors (fixedly mounted to either or both terminals 514 and/or terminals 520 can be an example of such electrical connectors. Interposers 518 can be another example of such electrical connections, which are shown in FIGS. 5 and 6A connecting the terminals 514 with the terminals 520. In some embodiments, each interposer 518 can include electrically conductive spring interconnects 526 and 528 that extend from opposite sides of an interposer body 524 (e.g., a printed circuit board, and semiconductor substrate, a ceramic substrate, etc.). Individual spring interconnects 526 extending from one side of the interposer body 524 can be electrically connected through the interposer body 524 to individual spring interconnects 528 on the opposite side of the interposer body 524. As shown in FIGS. 5 and 6A, the interposers 518 can be disposed in openings 516 in the frame 408. Each probe assembly 414 can include a rigid or semi-rigid probe substrate 410 (e.g., a ceramic substrate, a multi-layer printed circuit board, a semiconductor substrate, etc.) and electrically conductive probes 412 for contacting terminals 116 of the DUTs 118 (see FIG. 1). A "DUT," which is an acronym for "device under test," can be any electronic device including without limitation semiconductor dies (singulated or in wafer form, packaged or unpackaged). The terminals 520 on the probe substrate 410 can be electrically connected to the probes 412 by electrical connections 522 (e.g., traces and/or vias on and/or in the probe substrate 410).

With reference to FIGS. 5 and 6B, mechanical coupling within the probe card assembly 400 will now be discussed. As shown, the wiring substrate 406 can be disposed between the stiffener 402 and the frame 408. The stiffener 402 can comprise a mechanically stiff structure that can stiffen the probe card assembly 400 in the "z" direction. In some embodiments, the stiffener 402 can comprise metal such as stainless steel or aluminum. The stiffener 402 can be in the form of a plate structure, which can be a solid, layered, or honeycombed structure. The stiffener 402 can provide at least one or more of the following: be sufficiently stiff to minimize deformation of the probe card assembly 400 due to probe loads applied to or generated within the probe card assembly 400; minimize deformation of the wiring substrate 406 due to connection loads (e.g., interposer 518 loads); be sufficiently stiff to allow bending of the frame 408 relative to the stiffener 402; be a structural connector for the frame 408; provide mechanical coupling to the housing 120 (see FIG. 1); be thermally conductive to minimize warping due to thermal gradients; and/or provide alignment between the probe card assembly 400 and the test system 100.

The frame 408 can also function as a stiffener structure and stiffen the probe card assembly 400 in the "z" direction. The frame 408 can comprise a metal plate. As discussed above and shown in FIGS. 5 and 6A, the frame 408 can include openings 516 for the interposers 518.

As shown in FIGS. 5 and 6B, the stiffener 402, the wiring substrate 406, and the frame 408 can be disposed in a stack in which the "z" direction is generally perpendicular to the stack and the "x,y" plane is generally parallel with the stack. As also shown in FIGS. 5 and 6B, probe assemblies 414 can be coupled and/or adjacent to a major surface 534 of the frame 408, which can be an outer surface of the frame 408 in the stack. For example, as will be seen, pins can couple the probe assemblies 414 to holes in the major surface 534 of the frame 408. The major surface 534 of the frame 408 can be generally in the "x,y" plane, and the "z" direction can be generally perpendicular to the major surface 534. As will be seen, one or more pairs of the stiffener 402, the wiring substrate 406, the frame 408, and the probe assemblies 414 can be coupled to each other to allow thermal expansion or contraction in the "x,y" plane while being stiff in the "z" direction.

Figure 7:
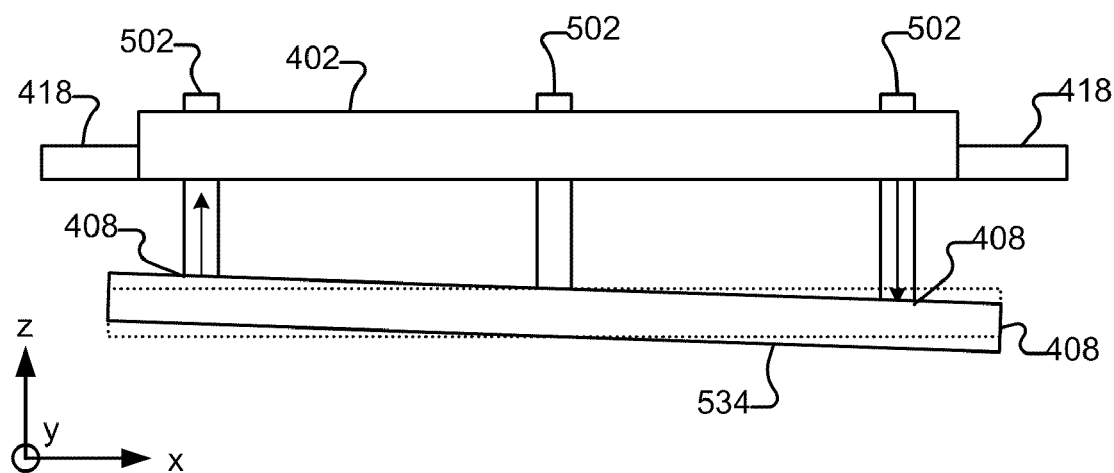
FIG. 7 illustrates use of first adjustable coupling mechanisms to change a tilt of the frame of the probe card assembly of FIG. 4 with respect to the stiffener.
Figure 8:
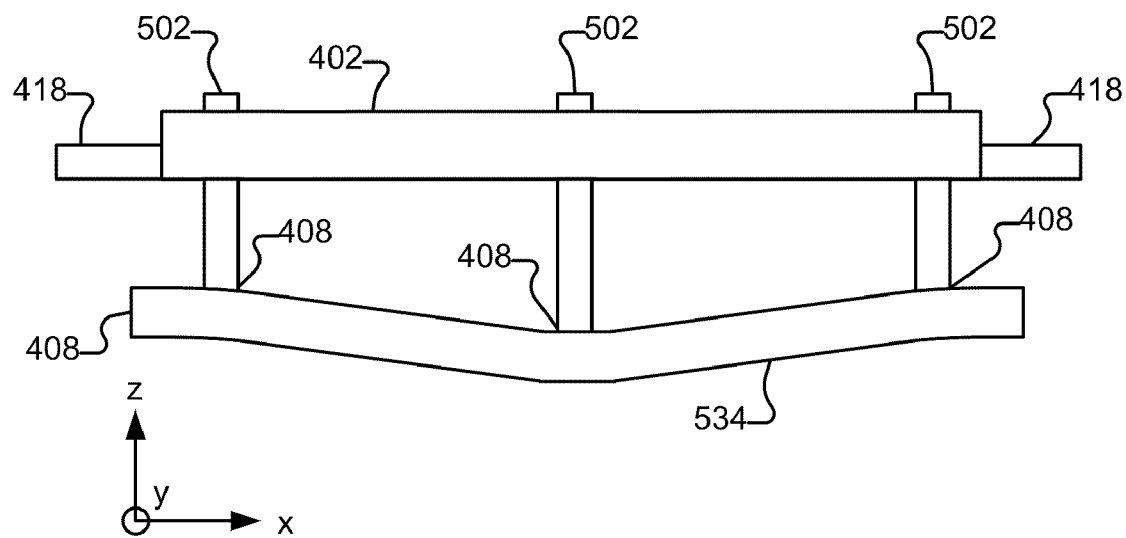
FIG. 8 illustrates use of the first adjustable coupling mechanisms to change a shape of a major surface of the frame of the probe card assembly of FIG. 4.

As shown in FIGS. 5 and 6B, first adjustable coupling mechanisms 502 can couple the stiffener 402 and the frame 408. As shown, each first adjustable coupling mechanism 502 can include a lock 538 and an adjustor 536. While the lock 538 is unlocked, manipulation of the adjustor 536 can move a part of the frame 408 in the "z" direction toward or away from the frame 408. For example, manipulation of the adjustor 536 can move the part of the frame 408 to which the first adjustable coupling mechanism 502 is coupled away from or move that part of the frame 408 toward the stiffener 402. A plurality of the first adjustable coupling mechanisms 502 coupled to different parts of the frame 408 can thus be used to change a tilt or even a shape of the major surface 534 of the frame 408 with respect to the stiffener 402. Non-limiting examples are shown in FIGS. 7 and 8. By changing a tilt or shape of the major surface 534 of the frame 408, an orientation of contact portions of the probes 412 is changed.

As shown in FIG. 7, the tilt of the frame 408 with respect to the stiffener 402 can be changed by manipulating one or more of the first adjustable coupling mechanisms 502 (while unlocked) to move one part 408 of the frame 408 toward the stiffener 402 while manipulating one or more others of the first adjustable coupling mechanisms 502 to move another part 408 of the frame 408 away from the stiffener 402. As another example, which is shown in FIG. 8, the shape of the major surface 534 can be changed by manipulating one or more of the first adjustable coupling mechanisms 502 and 502 (while unlocked) to move one or more parts of the frame 408 toward the stiffener 402 while manipulating one or more others of the first adjustable coupling mechanisms 502 to move another part of the frame 408 away from the stiffener 402. Although two are shown, any number of the first adjustable coupling mechanisms 502 can be used to achieve the desired shape.

Figure 9:
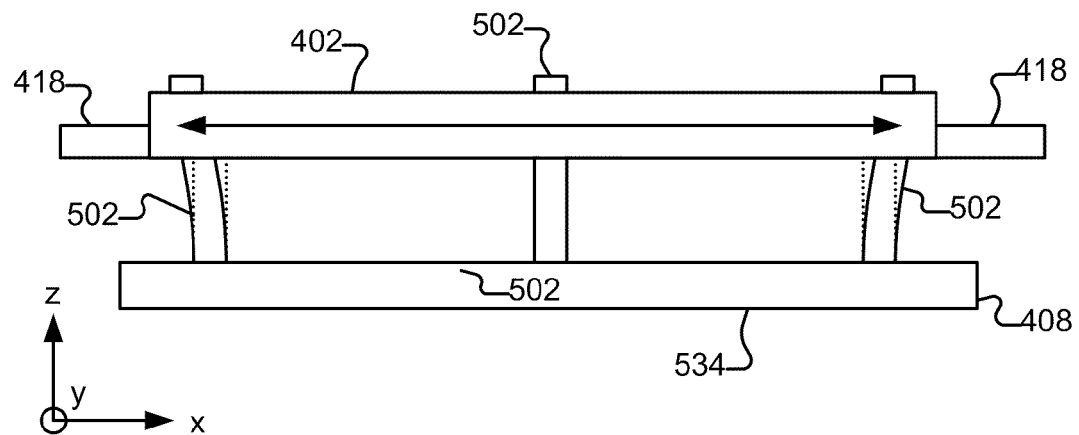
FIG. 9 illustrates that the first adjustable coupling mechanisms are stiff in the "z" direction and flexible in the "x,y" plane.

While the lock 538 is locked, however, the first adjustable coupling mechanisms 502 can be stiff in the "z" direction while simultaneously being flexible in the "x,y" plane. This can allow the stiffener 402 and the frame 408 to move (e.g., expand or contract) in the "x,y" plane with respect to each other as they expand or contract at different strains while impeding relative movement between the stiffener 402 and the frame 408 in the "z" direction. An example is illustrated in FIG. 9, which shows one or more of the first adjustable coupling mechanisms 502 flexing in the "x" and/or "y" directions to allow for relative movement in the "x,y" plane between the stiffener 402 and the frame 408 due, for example, to different thermal expansion or contraction. Note that one or more of the first adjustable coupling mechanisms 502 in FIG. 9 can flex in the "y" direction, which is into or out of the page in FIG. 9. In the specific example shown in FIG. 9, the stiffener 402 has expanded with respect to the frame 408, and one or more of the first adjustable coupling mechanisms 502 have flexed in the "x,y" plane. Note that the dashed lines in FIG. 9 show the first adjustable coupling mechanisms 502 before flexing. It is also noted that the first adjustable coupling mechanisms 502 can flex to accommodate expansion of the frame 408 with respect to the stiffener 402, contraction of the stiffener 402 with respect to the frame 408, or contraction of the frame 408 with respect to the stiffener 402. The first adjustable coupling mechanisms 502, while locked, can thus allow the stiffener 402 and the frame 408 to expand or contract differently without causing significant warping or bowing of the type shown in FIG. 3 and at the same time stiffen against (or impede) relative movement of the stiffener 402 and the frame 408 in the "z" direction. Significant warping or bowing is warping or bowing that adversely affects a process of testing DUTs 118 (e.g., causes one or more probes 412 to move out of contact with one or more terminals 116 of DUTs 118, or causes one or more probes 412 to press with excessive force against one or more of the terminals 116). The expansion or contraction can be such that the relative expansion and/or contraction is fixed with respect to a position on both the stiffener 402 and the frame 408. This position on the stiffener 402 and the corresponding position on the frame 408 can be thermal centroids that remain substantially stationary with respect to each other even as there is relative thermal expansion or contraction between the stiffener 402 and the frame 408. In some embodiments, the relative motion in the "x,y" plane between the stiffener 402 and the frame 408 can be proscribed by design of a particular level of flexibility into the first adjustable coupling mechanisms 502.

In some embodiments, the positions on the stiffener 402 and the frame 408 from which the relative expansion or contraction of the stiffener 402 and the frame 408 occurs can be defined by a mechanical mechanism such as the optional fixed coupling mechanism 550 shown in FIGS. 5 and 6B, which can be stiff in the "x,y" plane and thus restrict the relative movement in the "x,y" plane between the stiffener 402 and the frame 408 to be radial from the locations of the fixed coupling mechanism 550 on the stiffener 402 and the frame 408. If the fixed coupling mechanism 550 is present, it can be a bolt or a screw. In some embodiments, the fixed coupling mechanism 550 can thread into a threaded opening (not shown) in the stiffener 402 and/or a threaded opening (not shown) in the frame 408. Alternatively or in addition, the fixed coupling mechanism 550 can thread into a threaded opening (not shown) in the wiring substrate 406. Alternatively, the fixed coupling mechanism can pass through an oversized opening (not shown) in the wiring substrate 406.

In other embodiments, however, the pattern and configuration of the first adjustable coupling mechanisms 502 can define the positions on the stiffener 402 and the frame 408 from which the relative expansion or contraction occurs without the need for the fixed coupling mechanism 550. As will be discussed below with respect to the coupling mechanisms 504 and 552, in still other embodiments, the coupling mechanisms 504 and/or 552 can contribute to or substantially define the positions on the stiffener 402 and the frame 408 from which the relative expansion or contraction occurs without the need for the fixed coupling mechanism 550.

Regardless of whether such positions are defined a coupling mechanism like the fixed coupling mechanism 550 or by the pattern and configuration of the first adjustable coupling mechanisms 502, in some embodiments, the location of the location on the stiffener 402 can be approximately at a center of the stiffener 402, and the location of the fixed coupling mechanism 550 on the frame 408 can be approximately at a center of the frame 408. Alternatively, the location of the location on the stiffener 402 and/or the frame 408 can be at positions other than the center.

Figure 13:
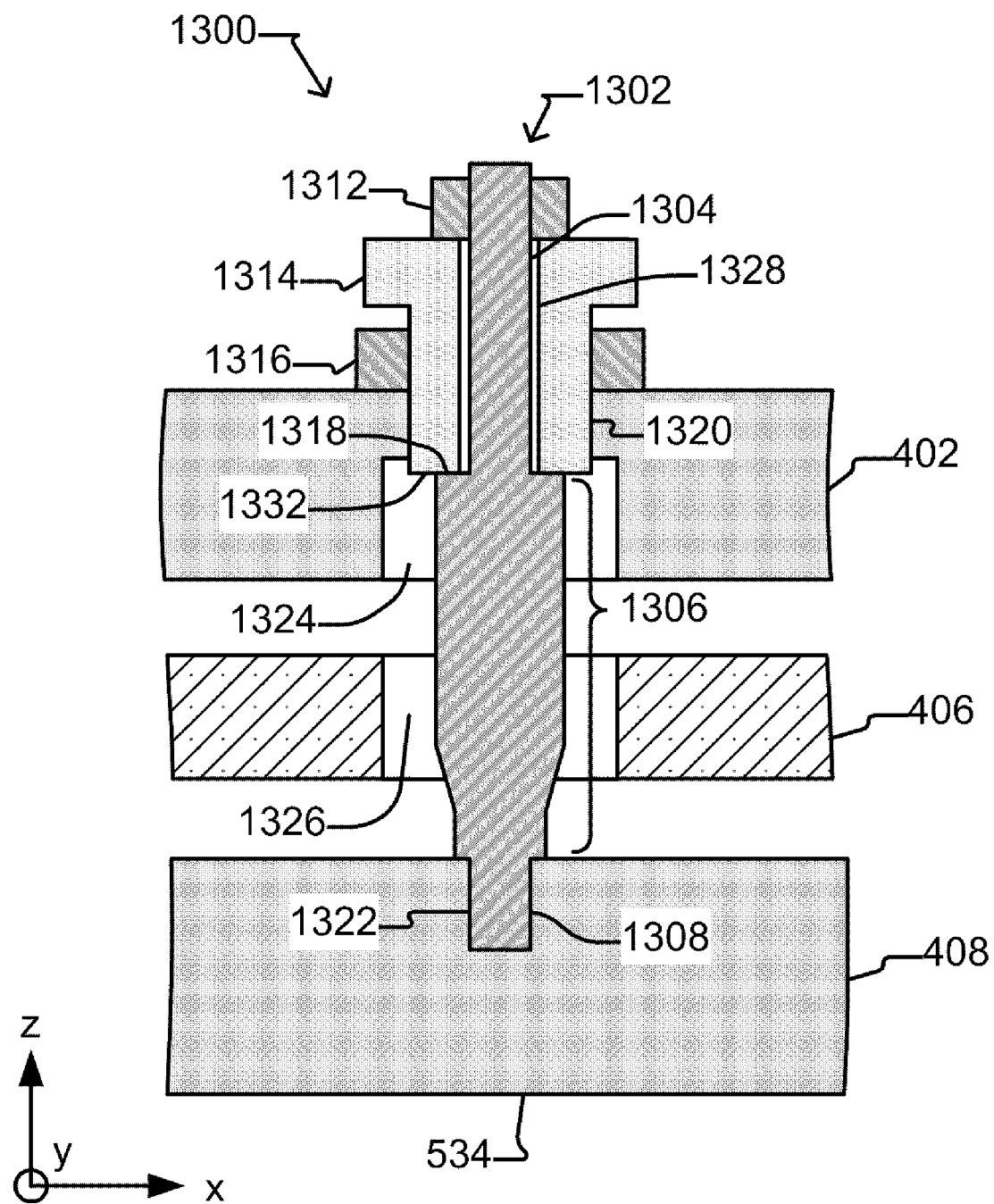
FIG. 13 illustrates an example of the first adjustable coupling mechanisms shown in FIGS. 5 and 6B.

Because the first adjustable coupling mechanisms 502 include the adjustor 536 that can be manipulated while the lock 538 is unlocked to alter a position in the "z" direction of part of the frame 408 as discussed above, the first adjustable coupling mechanisms 502 are "adjustable coupling mechanisms." Non-limiting examples of the first adjustable coupling mechanism 502 are illustrated in FIG. 13) and will be described below with reference to those figures.

It is noted that the first adjustable coupling mechanisms 502 need not include the lock 538. For example, each first adjustable coupling mechanism 502 can be self locking. In such an embodiment, for example each first adjustable coupling mechanism 502 can be stiff in the "z" direction and thus resist movement in the "z" direction except when the adjustor 536 is being activated to make the adjustments described above. In some embodiments the first adjustable coupling mechanisms 502 need not include the adjustment 538 and thus need not be adjustable. In embodiments in which the coupling mechanisms 502 are not adjustable, variations of the position in the "z" direction can be accounted for by controlling the position of the probe substrates 410.

Figure 24:
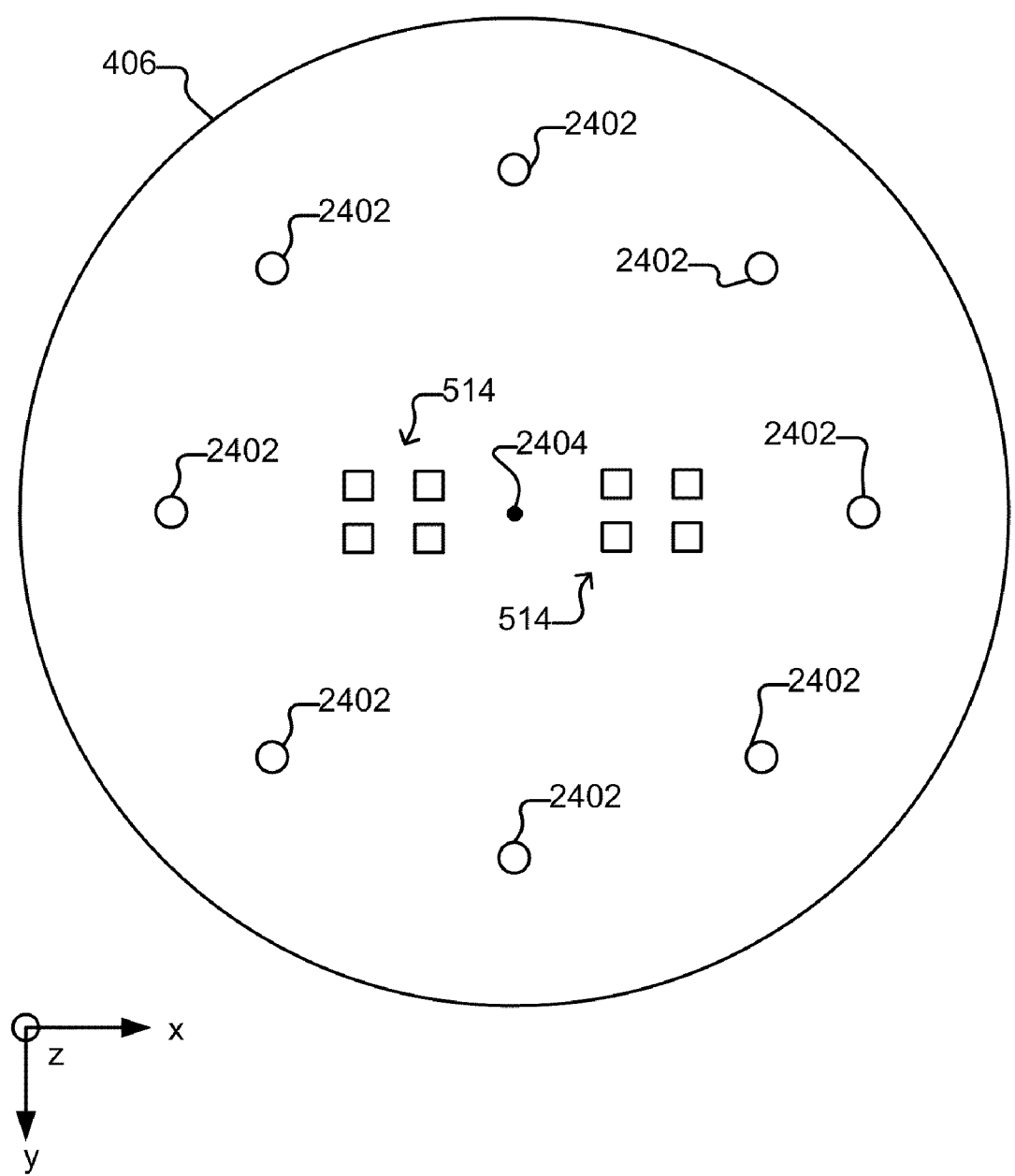
FIGS. 24, 25, and 26 illustrate an example of the coupling mechanisms of FIGS. 5 and 6B.
Figure 25:
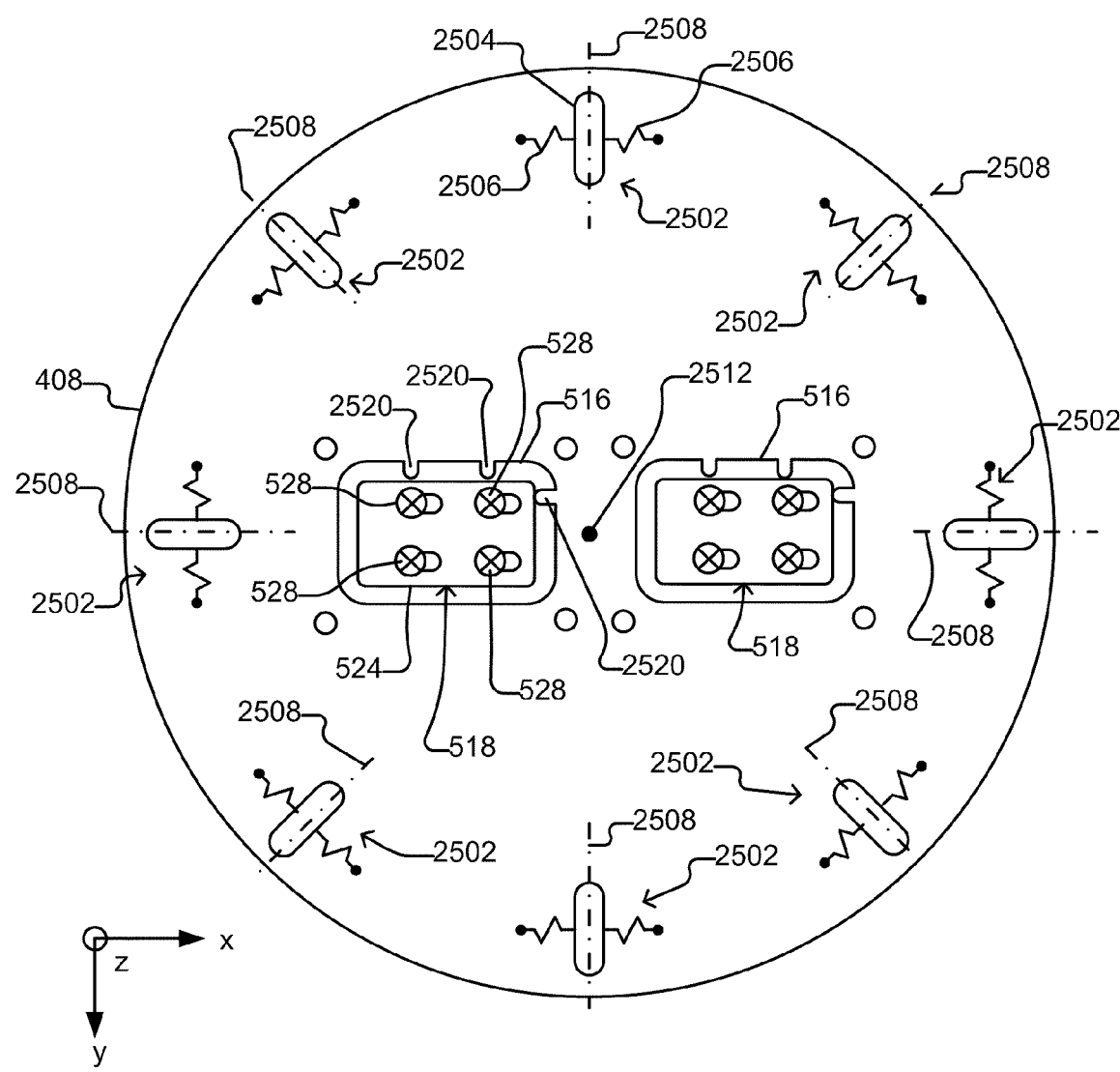
Figure 26:
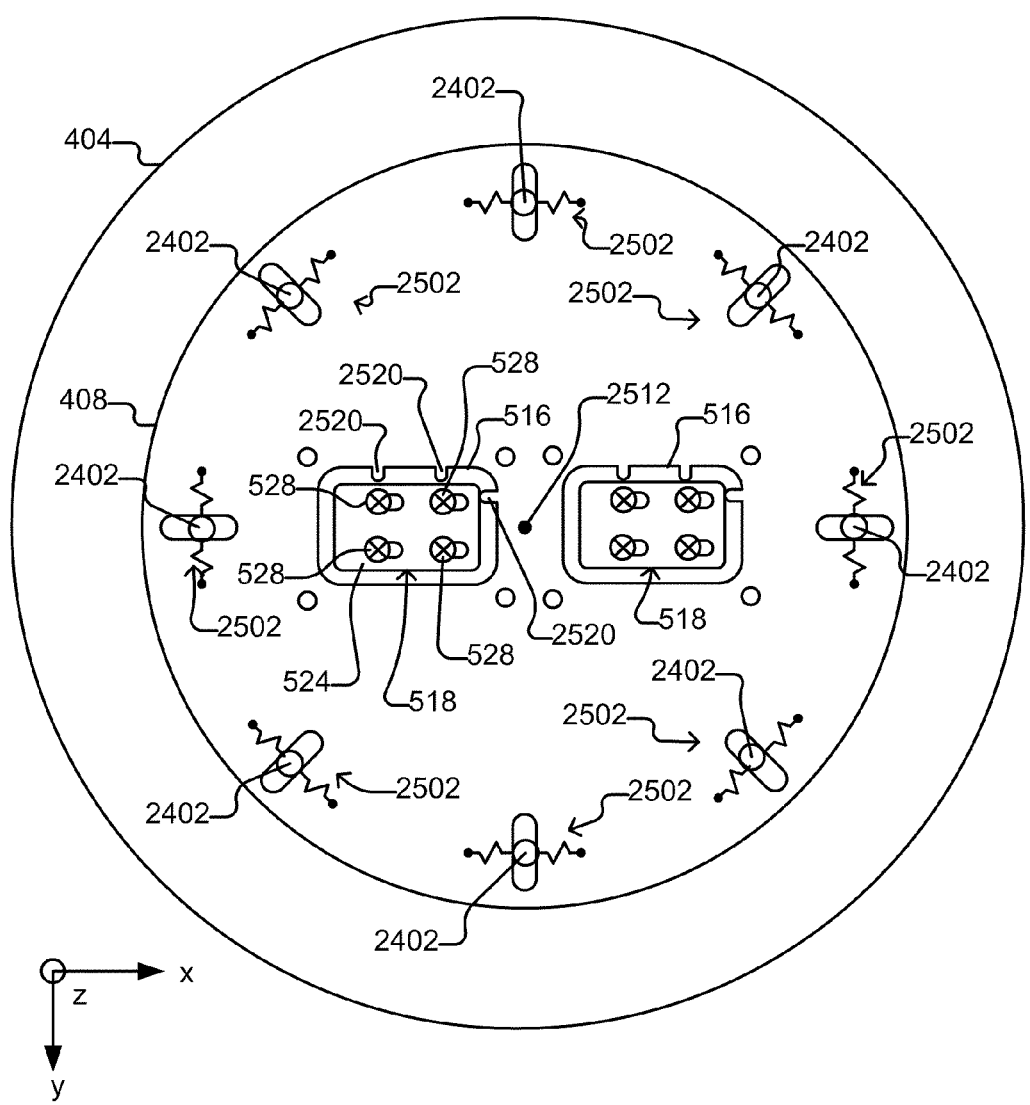

Still referring to FIGS. 5 and 6B, it is noted that coupling mechanisms 504 can couple the wiring substrate 406 and the frame 408. The coupling mechanisms 504 can allow limited movement in the "x,y" plane of the wiring substrate 406 with respect to the frame 408. The wiring substrate 406 and the frame 408 can thus expand or contract without causing significant warping or bowing of the type shown in FIG. 3. The coupling mechanisms 504 can also align the terminals 514 on the wiring substrate 406 and spring interconnects 526 of the interposers 518, which can be precisely positioned in the openings 516 in the frame 408 (see FIGS. 5, 6A, and 6B). Non-limiting examples of the coupling mechanisms 504 are illustrated in FIGS. 24, 25, and 26) and will be described below with reference to those figures. The coupling mechanisms 504 can be configured and disposed in a pattern that defines the positions on the stiffener 402 and the frame 408 from which the relative expansion or contraction of the stiffener 402 with respect to the frame 408 occurs. As also shown in FIGS. 5 and 6B, coupling mechanisms 552, which can be like coupling mechanisms 504, can couple the wiring substrate 406 to the stiffener 402. Generally like the coupling mechanisms 504, the coupling mechanisms 552 can be configured and disposed in a pattern that defines the positions on the stiffener 402 and the frame 408 from which the relative expansion or contraction of the stiffener 402 with respect to the frame 408 occurs.

Figure 1:
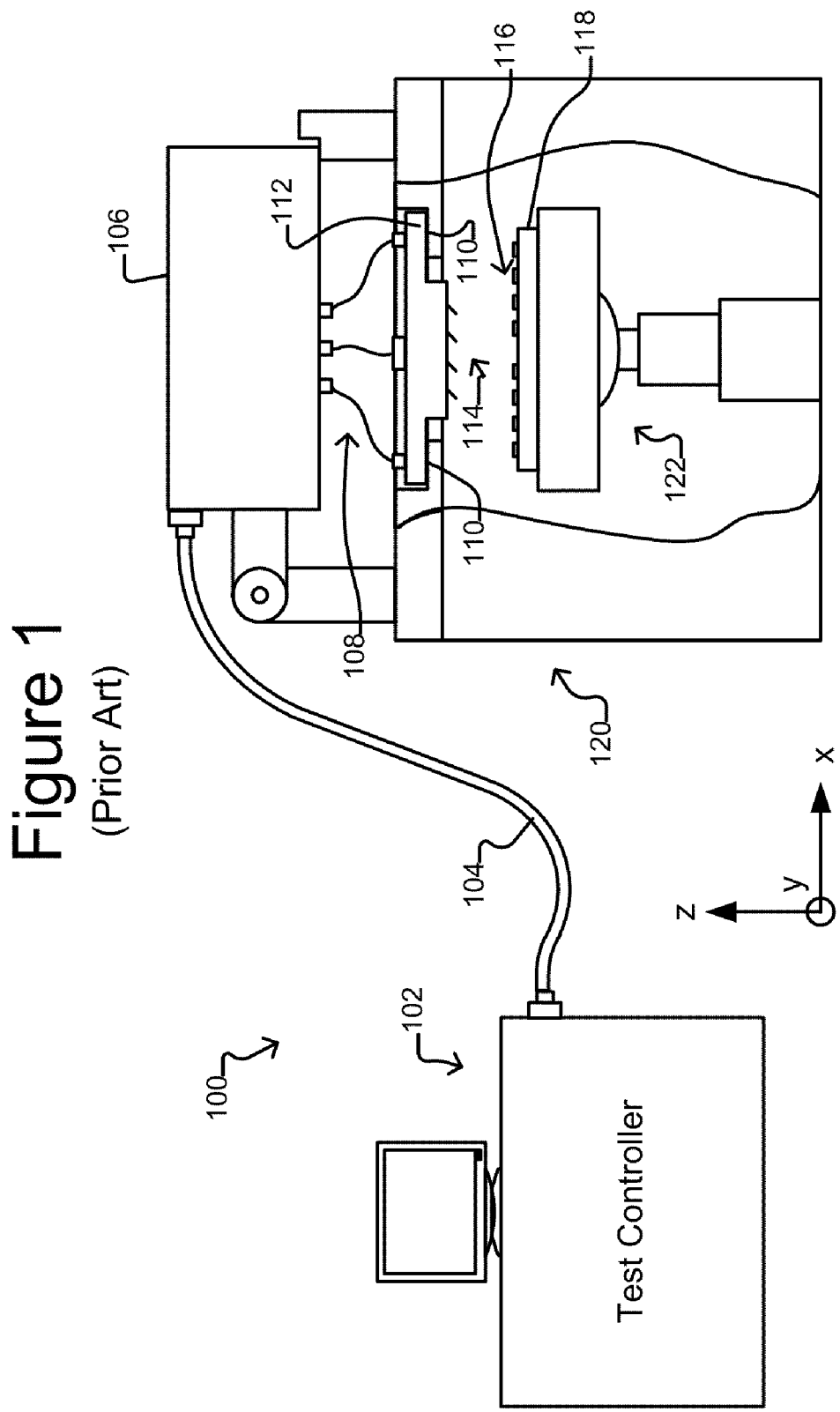
FIG. 1 illustrates a prior art test system for testing electronic devices.
Figure 2:
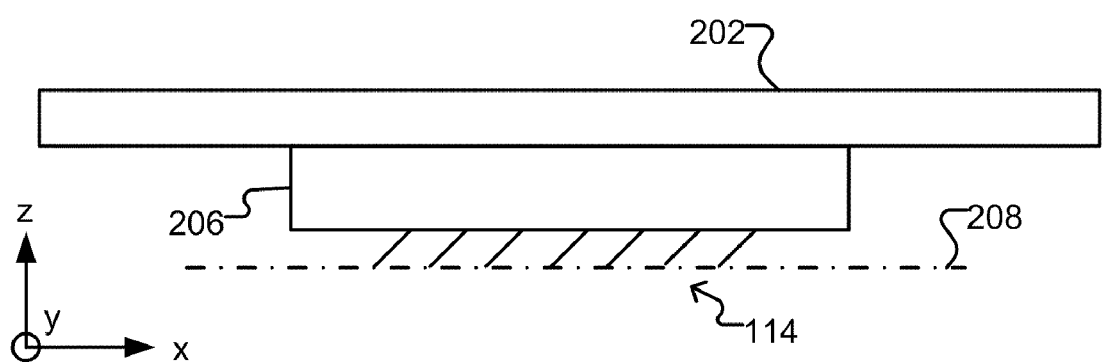
FIG. 2 illustrates a prior art probe card assembly.

Still referring to FIGS. 5 and 6B, it is noted that the probe card assembly 400 can be coupled to the mounting surface 110 of the housing 120 in the test system 100 of FIG. 1 in place of the probe card assembly 112 in the test system of FIG. 1. In some embodiments, the stiffener 402 can include coupling arms 418 that can be coupled to and removed from the mounting surface 110 of the housing 120. As shown in FIGS. 5 and 6B, in some embodiments, the coupling arms 418 can be coupled to the mounting surface 110 by second adjustable coupling mechanisms 508. In some embodiments, the second adjustable coupling mechanisms 508 can be similar to the first adjustable coupling mechanisms 502.

As shown in FIGS. 5 and 6B, each second adjustable coupling mechanism 508 can include a lock 542 and an adjustor 540. While the lock 542 is unlocked, manipulation of the adjustor 540 can move a coupling arm 418 of the stiffener 402 in the "z" direction toward or away from the mounting surface 408. For example, manipulation of the adjustor 540 can move the coupling arm 418 of the stiffener 402 to which the second adjustable coupling mechanism 508 is coupled away from mounting surface 110 or move a coupling arm 418 toward the mounting surface 110. A plurality of the second adjustable coupling mechanisms 508 coupled to different coupling arms 418 of the stiffener 402 can thus be used to change a tilt of the stiffener 402 with respect to the mounting surface 110. Non-limiting examples are shown in FIGS. 10 and 11.

Figure 10:
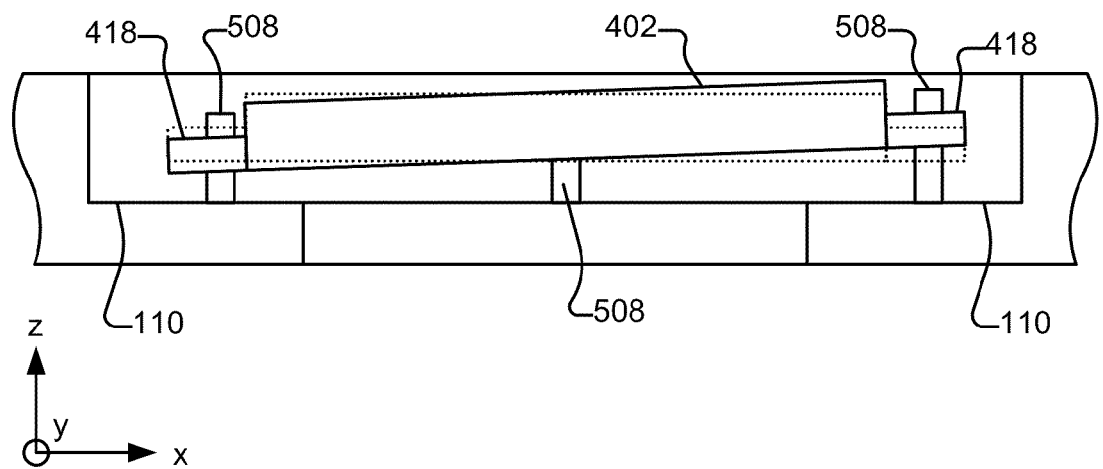
FIG. 10 illustrates use of second adjustable coupling mechanisms to change a tilt of the stiffener of the probe card assembly of FIG. 4 with respect to a mounting surface.
Figure 11:
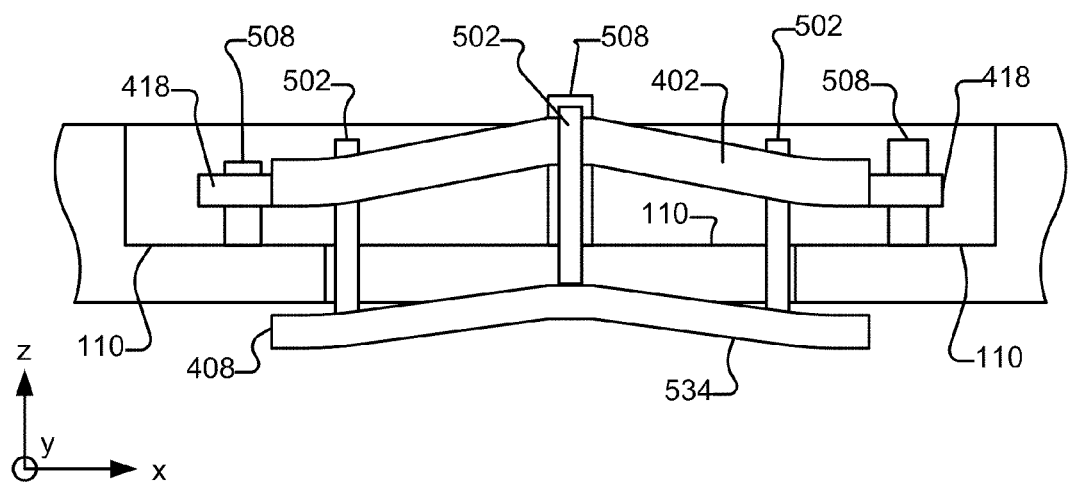
FIG. 11 illustrates use of the second adjustable coupling mechanisms to change a shape of a major surface of the frame of the probe card assembly of FIG. 4.

As shown in FIG. 10, the tilt of the stiffener 402 with respect to the mounting surface 110 can be changed by manipulating one or more of the second adjustable coupling mechanisms 508 (while unlocked) to move one or more coupling arms 418 of the stiffener toward or away from the mounting surface 110. In addition, as illustrated in FIG. 11, a shape of the stiffener 402 can be changed by manipulating one or more of the second adjustable coupling mechanisms 508 (while unlocked) to move one or more coupling arms 418 toward or away from the mounting surface 110. Any number of the second adjustable coupling mechanisms 508 can be adjusted to achieve the desired shape. As also shown in FIG. 11, because the stiffener 402 is coupled to the frame 408 by the first adjustable coupling mechanisms 502, the change in shape of the stiffener 402 results in a corresponding change in shape of the major surface 534 of the frame 408.

Figure 12:
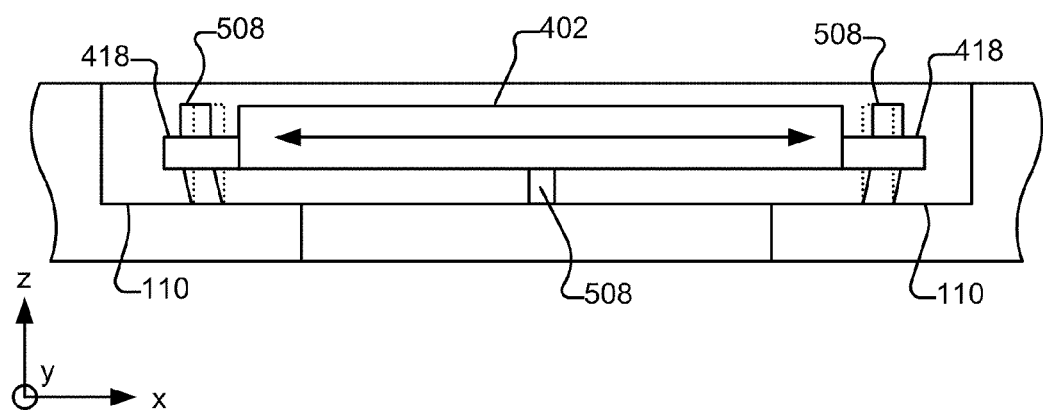
FIG. 12 illustrates that the second adjustable coupling mechanisms are stiff in the "z" direction and flexible in the "x,y" plane.

Similar to the first adjustable coupling mechanisms 502, however, while the lock 542 is locked, the second adjustable coupling mechanisms 508 can be stiff in the "z" direction while simultaneously being flexible in the "x,y" plane. This can allow the stiffener 402 and the mounting surface 110 to move (e.g., expand or contract) in the "x,y" plane with respect to each other as they expand or contract differently while impeding relative movement between the stiffener 402 and the mounting surface 110 in the "z" direction. This is illustrated in FIG. 12, which shows second adjustable coupling mechanisms 508 flexing in the "x" and/or "y" directions to allow relative movement between the stiffener 402 and the mounting surface 110 due to, for example, different thermal expansion or contraction. The second adjustable coupling mechanisms 508, while locked, can thus allow the stiffener 402 and the mounting surface 110 to expand or contract differently without causing the warping or bowing shown in FIG. 3 and at the same time stiffen against (or impede) relative movement between the stiffener 402 and the mounting surface 110 in the "z" direction. The second adjustable coupling mechanisms 508 can be disposed in a pattern with respect to a location on the stiffener 402 such that the relative movement in the "x,y" plane between the stiffener 402 and the mounting surface 110 is radial from the location. For example, the second adjustable coupling mechanisms 508 can be disposed in generally a circle, which can cause the relative movement in the "x,y" plane between the stiffener 402 and the mounting surface 110 to be radial from a location on the stiffener 402 that corresponds to a center of the circle. Alternatively or in addition, the location on the stiffener 402 from which radial relative movement in the "x,y" plane between the stiffener 402 and the mounting surface 110 occurs can be defined by coupling mechanisms similar to coupling mechanisms 504 and 552 but between the mounting surface 110 and the coupling arms 418 (or the stiffener 402). For example, such coupling mechanisms between the mounting surface 110 and the coupling arms 418 (or the stiffener 402) can comprise alignment features like the alignment features 2402 of FIG. 24 extending from the mounting surface 110 or the coupling arms 418 (or the stiffener 402) and corresponding constraints like the constraints 2502 of FIG. 25 on the other of the mounting surface 110 or the coupling arms 418 (or the stiffener 402).

Figure 27:
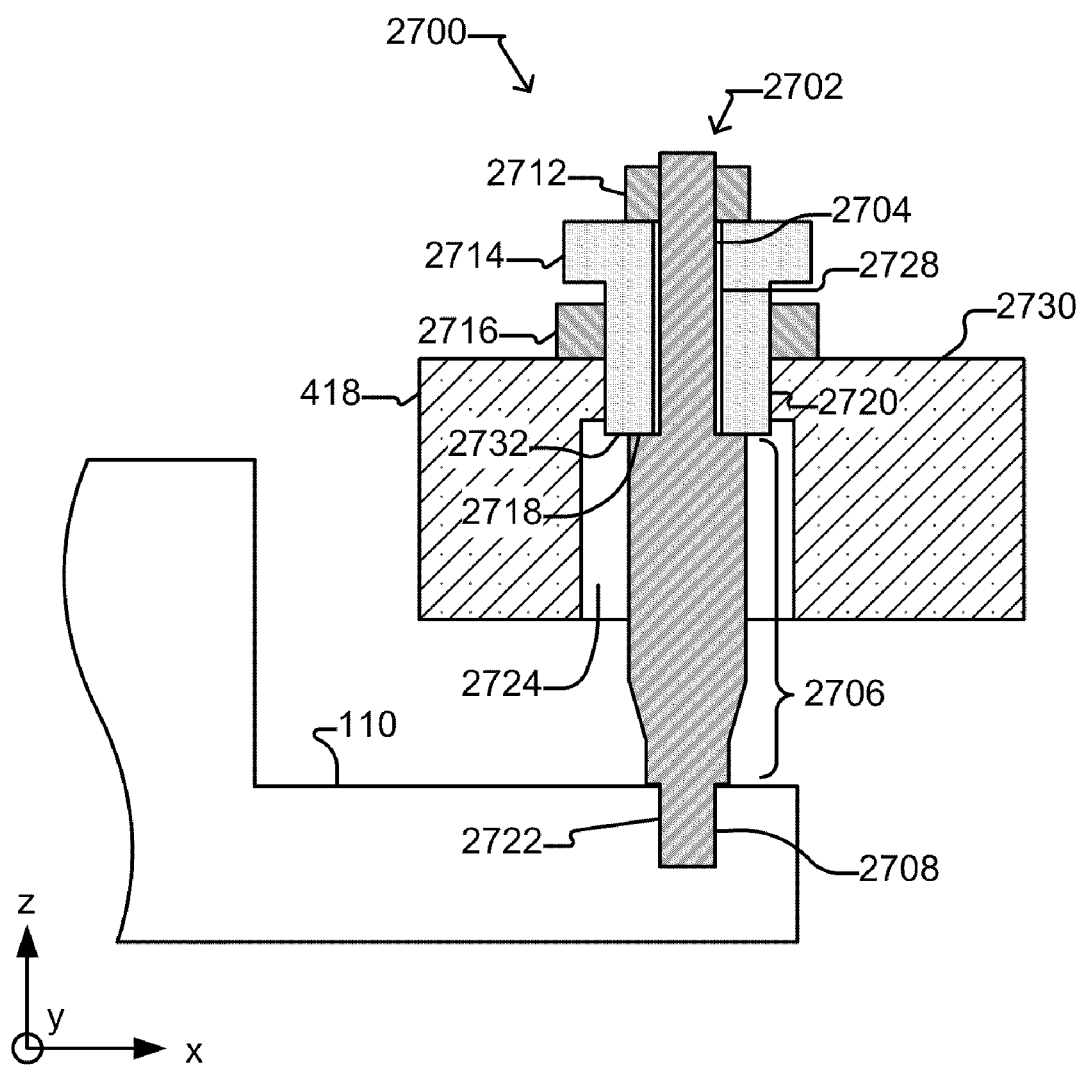
FIG. 27 illustrates an example of the second adjustable coupling mechanisms of FIGS. 5 and 6B.

Because the second adjustable coupling mechanisms 508 include the adjustor 540 that can be manipulated while the lock 542 is unlocked to alter a position in the "z" direction of the coupling arms 418 of the stiffener 402 as discussed above, the second adjustable coupling mechanisms 508 are "adjustable coupling mechanisms." Non-limiting examples of the second adjustable coupling mechanism 502 are illustrated in FIG. 27 and will be described below with reference to those figures.

With reference still to FIGS. 5 and 6B, it is noted that non-adjustably fixed coupling mechanisms 506 can couple the probe assemblies 414 to the frame 408. The non-adjustably fixed coupling mechanisms 506 can be stiff in the "z" direction but flexible in the "x,y" plane, allowing each probe assembly 414 and the frame 408 to move (e.g., expand or contract) in the "x,y" plane with respect to each other as they expand or contract differently. The frame 408 and the probe assemblies 414 can thus expand or contract without causing significant warping or bowing of the type shown in FIG. 3 and at the same time stiffen against (or impede) relative movement of the probe assemblies 414 and the frame 408 in the "z" direction due to external forces such as loads on the probes 412.

The expansion or contraction between the frame 408 and each probe substrate 410 can be such that the relative expansion and/or contraction is fixed with respect to a position on the probe substrate 410 and a corresponding position on the frame 408. In some embodiments, the position on the frame 408 from which the relative expansion or contraction of the probe substrate 410 and the frame 408 occurs can be defined by a mechanical mechanism such as a fixed coupling mechanism 506 disposed approximately at a center of a probe substrate 410. In such an embodiment, the relative expansion or contraction of the probe substrate with respect to the frame 408 can be radial from the center of the probe substrate. In other embodiments, however, the pattern and configuration of the fixed coupling mechanisms 506 can define the position on a probe substrate 410 from which the relative expansion or contraction occurs without the need for a fixed coupling mechanism 506 at that point.

It is noted that the non-adjustably fixed coupling mechanisms 506 do not include an adjustor like adjustor 536 for moving a probe assembly 414 in the "z" direction. Thus, once the non-adjustably fixed coupling mechanisms 506 are fixed in place, the non-adjustably fixed coupling mechanisms 506 do not provide the ability to move any part of a probe assembly 414 in the "z" direction. Because the non-adjustably fixed coupling mechanisms 506 do not provide the ability to move any part of a probe assembly 414 in the "z" direction, the non-adjustably fixed coupling mechanisms 506 are "non-adjustably fixed coupling mechanisms." Non-limiting examples of the non-adjustably fixed coupling mechanisms 506 are illustrated in FIGS. 14, 15, 16, 17, 18, 19, 20, 21, 22, and 23) and will be described below with reference to those figures.

As yet another example, each of the probe substrates 410 can be sufficiently small that the magnitude of the difference in thermally induced motion of the probe substrates 410 relative to the DUT 118 can be small enough to be negligible. In some embodiments, this can be the case if the difference in the thermally induced motion (expansion or contraction) of the DUT 118 and the thermally induced motion (expansion or contraction) of each of the probe substrates 410 is sufficiently small to be negligible given the particular test conditions. In some embodiments, such a difference can be negligible if the probes 412 of the probe substrates 410 will remain in contact with the terminals 116 of the DUT 118 over the entire temperature change that occurs during testing of the DUT 118. The thermally induced motion of a probe substrate 410 can be as follows: $CTE_{probe\ substrate} * \Delta T_{probe\ substrate} * L_{probe\ substrate}$, where $CTE_{probe\ substrate}$ is the coefficient of thermal expansion of a probe substrate 410, *means multiplication, $\Delta T_{probe\ substrate}$ is the difference between the actual temperature of the probe substrate 410 at any given time during the testing of the DUT 118 and a reference temperature, and $L_{probe\ substrate}$ is the distance between any two of the probes 412 attached to the probe substrate 410 (e.g., the longest distance between two of the probes 412). The thermally induced motion of the DUT 118 can be as follows: $CTE_{DUT} * \Delta T_{DUT} * L_{DUT}$, where $CTE_{DUT}$ is the coefficient of thermal expansion of the DUT 118, *means multiplication, $\Delta T_{DUT}$ is the difference between the actual temperature of the DUT 118 at any given time during the testing of the DUT 118 and a reference temperature, and $L_{DUT}$ is the distance between any two of the terminals 116 of the DUT 118 (e.g., the longest distance between two of the terminals 116).

The electrical and mechanical configurations shown in FIGS. 5, 6A, and 6B are examples only, and variations are possible. For example, any of the first adjustable coupling mechanisms 502, non-adjustably fixed coupling mechanisms 506, coupling mechanisms 504 and 550, and second adjustable coupling mechanisms 508 in FIGS. 5 and 6B can be replaced with coupling mechanisms that are not flexible in the "x,y" plane.

Figure 3:
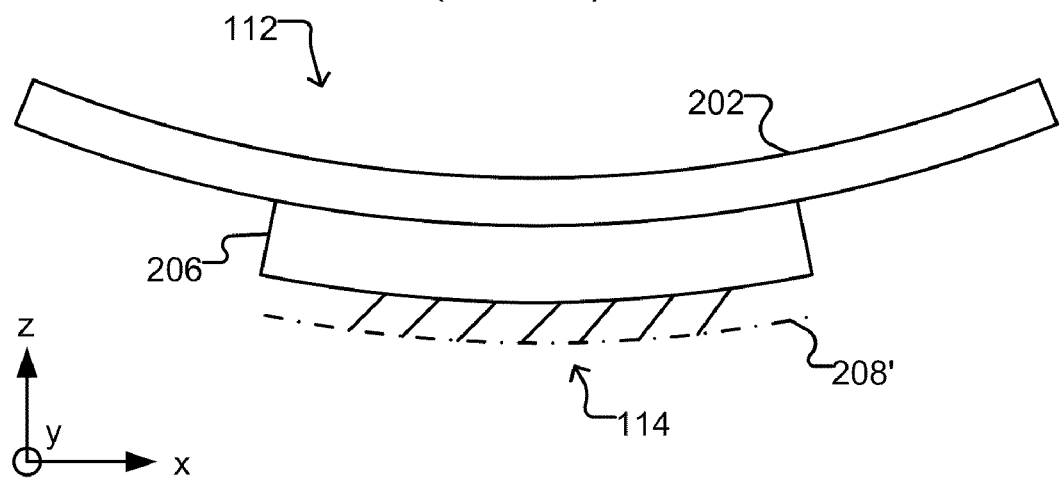
FIG. 3 illustrates warping of the prior art probe card assembly of FIG. 2.

For example, in some embodiments, the thermal strain of the probe substrates 410, on one hand, and the thermal strain of the frame 408, on the other hand, can be selected to be approximately equal, which will eliminate or reduce to a negligible level the type of warping or bowing effect illustrated in FIG. 3. In such a case, the non-adjustably fixed coupling mechanisms 506 need not be flexible in the "x,y" plane. The thermal strain of a probe substrate 410 is as follows: $CTE_{probe\ substrate} * \Delta T_{probe\ substrate}$, where $CTE_{probe\ substrate}$ is the coefficient of thermal expansion of a probe substrate 410, *means multiplication, and $\Delta T_{probe\ substrate}$ is the difference between the actual temperature of the probe substrate 410 at any given time during use of the probe card assembly 400 and a reference temperature. The thermal strain of the frame 408 as follows: $CTE_{frame} * \Delta T_{frame}$, where $CTE_{frame}$ is the coefficient of thermal expansion of the frame 408, *means multiplication, and $\Delta T_{frame}$ is the difference between the actual temperature of the frame 408 at any given time during use of the probe card assembly 400 and a reference temperature. The thermal strain of the probe substrates 410, on one hand, and the thermal strain of the frame 408 can be made equal or approximately equal by selecting the material of the probe substrates 410 and the material of the frame 408, and/or alternatively or in addition, controlling the temperature of the probe substrates 410 and/or the frame 408 during operation of the probe card assembly 400 so that the thermal strain of the probe substrates 410 equals or approximately equals the thermal strain of the frame 408. In some embodiments, the temperature of the frame 408 can be controlled by including one or more temperature control devices in the probe card assembly 400. For example, a band heater 416, as shown in FIGS. 4 and 5 can be disposed around the frame 408 and controlled during use of the probe card assembly 400 to control the temperature of the frame 408 to keep the thermal strain of the frame 408 to a desired thermal strain or equal or approximately equal to the thermal strain of the probe substrates 410. A similar temperature control device or devices (not shown) can be included in the probe card assembly 400 to control the temperature of the stiffener 402 during use of the probe card assembly 400.

Although any of the first adjustable coupling mechanisms 502, non-adjustably fixed coupling mechanisms 506, coupling mechanisms 504, and second adjustable coupling mechanisms 508 in FIGS. 5 and 6B can be replaced with coupling mechanisms that are not flexible in the "x,y" plane, non-limiting examples of each of the coupling mechanisms 502, 504, 506, 508, and 550 that are flexible in the "x,y" plane are nevertheless shown in the figures and discussed below.

FIG. 13 illustrates a non-limiting example of the first adjustable coupling mechanism 502 in the form of a bolt assembly 1300. (FIG. 13 shows a simplified, partial view of the stiffener 402, the wiring substrate 406, and the frame 408.) As shown, the bolt assembly 1300 can include a shaft 1302, an adjustment nut 1314, a locking nut 1316, and a tightening nut 1312. Moreover, the shaft 1302 can include a threaded upper shaft 1304, a flexible middle portion 1306, and a threaded end portion 1308. The upper shaft 1304 can be threaded along all or at least a portion of the shaft so that the tightening nut 1312 can be threaded onto the shaft 1304. The middle portion 1306 can be patterned to increase the flexibility of the middle portion 1306. For example, the middle portion 1306 can include one or more narrowed sections (not shown). Indeed, there are many ways to increase the flexibility of the middle portion 1306, any of which can be used.

As also shown, the stiffener 402 can have a threaded upper hole 1320 and a lower oversized hole 1324 that align generally with an oversized hole 1326 in the wiring substrate 406 and a threaded hole 1322 in the frame 408. The adjustment nut 1314 can be threaded and can thread into the threaded upper hole 1320 in the stiffener 402. Turning the adjustment nut 1314 one direction can move the adjustment nut 1314 toward the frame 408, and turning the adjustment nut 1314 the opposite direction can move the adjustment nut 1314 away from the frame 408. Thus, the position of a lower end 1332 of the adjustment nut 1314 can be positioned by turning the adjustment nut 1314. The locking nut 1316 can lock the adjustment nut 1314 in place. Thus, the adjustment nut 1314 can be turned only while the locking nut 1316 is unlocked but cannot be turned (with reasonable or typical force) in either direction while the locking nut 1316 is locked. The lower end 1332 can thus be positioned to and locked in a desired location.

As also shown, the threaded end portion 1308 of the shaft 1302 can thread into the threaded hole 1322 in the frame 408, and the flexible middle portion 1306 can be in the oversized hole 1326 in the wiring substrate 406 and the oversized hole 1324 in the stiffener 402. The upper shaft 1304 can pass through a hole 1328 in the adjustment nut 1314. As mentioned, the upper shaft 1304 can be threaded so that the tightening nut 1312 can thread onto the shaft 1304. The hole 1328 in the adjustment nut 1314, however, is not threaded. Thus, the upper shaft 1304 of the shaft 1302 can move in the "z" direction (e.g., up and down) within the hole 1328. Threading the tightening nut 1312 onto the upper shaft 1304 of the shaft 1302 and tightening the tightening nut 1312 against the adjustment nut 1314, pulls the upper shaft 1304 of the shaft 1302—and thus the shaft 1302—upward through the hole 1328 until the shoulder 1318 of the shaft 1302 contacts the lower end 1332 of the adjustment nut 1314. The position of the adjustment nut 1314—or more specifically, the position of the lower end 1332 of the adjustment nut 1314—thus determines the distance between the stiffener 402 and the part of the frame 408 where the threaded hole 1322 is located.

As mentioned, the bolt assembly 1300 can be an example of the first adjustable coupling mechanism 502 in FIGS. 4, 6, 7, and 8. A bolt assembly 1300 can thus replace each of the first adjustable coupling mechanisms 502 in those figures. In accordance with the description above of FIGS. 7 and/or 8, one or more of the first adjustable coupling mechanisms 502 in FIGS. 7 and/or 8—each implemented as a bolt assembly 1300 of FIG. 13—can be used to set an individually selected distance between the stiffener 402 and part of the frame 408 as described above with regard to FIG. 13 and thereby effect a desired tilt of the frame 408 with respect to the stiffener 402 as illustrated in FIG. 7 and/or change the shape of the major surface 534 of the frame 408 as illustrated in FIG. 8.

Each of the bolt assemblies 1300 can be operated as follows. The tightening nut 1312 can be loosened or removed, and the locking nut 1316 can be unlocked. The adjusting nut 1314 can then be turned until the distance between the stiffener 402 and the part of the frame 408 where the lower hole 1322 is located is a desired distance. The locking nut 1316 can then be locked, which as discussed above, prevents the adjustment nut 1314 from being turned (by reasonable or typical force) and thus locks the position of the lower end 1332. The tightening nut 1312 can then be threaded onto the upper shaft 1304 of the shaft 1302 and tightened against the adjustment nut 1314, which as discussed above, pulls the shoulder 1318 of the shaft 1302 against the lower end 1332 of the adjustment nut 1314. As shown in FIGS. 4 and 6 and discussed above, a plurality of second adjustable coupling mechanisms 508 can couple the stiffener 402 to the frame 408, and each such second adjustable coupling mechanism 508 can be implemented as the bolt assembly 1300 shown in FIG. 13. By operating one or more of such bolt assemblies 1300 as discussed above, the tilt of the frame 408 can be changed as illustrated in FIG. 7 and/or the shape of the major surface 434 of the frame 408 can be changed as illustrated in FIG. 8.

Thereafter, the frame 408 can be removed and replaced by operating each bolt assembly 1300 as follows. The tightening nut 1312 can be removed, allowing the upper shaft 1304 of the shaft 1302 to be pulled out of the hole 1328. The frame 408 can thus be removed from the stiffener 402 and removed. The locking nut 1316 need not, however, be unlocked. Consequently, the lower end 1332 of the adjustment nut 1314 will remain in the same location. The same or a different frame 408 can be coupled to the stiffener 402 by inserting the upper shaft 1304 of each shaft 1302 threaded into a hole 1322 in the frame 408 through the hole 1328 in a corresponding adjustment nut 1314 and then threading a tightening nut 1312 onto the upper shaft 1304 of the shaft 1302 and tightening the tightening nut 1312 against the adjustment nut 1314. Because the position of the lower end 1332 of each of the adjustment nuts 1314 was not changed, the tilt of the frame 408 and/or the shape of the major surface 434 of the frame 408 will be approximately the same as before the frame 408 was removed and replaced.

As mentioned, the bolt assembly 1300 is an example of the first adjustable coupling mechanism 502 shown in FIGS. 5 and 6B. Moreover, the locking nut 1316 is an example of the lock 538, and the adjustment nut 1314 is an example of the adjustor 536 in FIGS. 5 and 6B. It is noted that, while the locking nut 1316 is locked, each bolt assembly 1300 can be stiff in the "z" direction while being simultaneously flexible in the "x,y" plane as illustrated in FIG. 9 and discussed above. As discussed above, the first adjustable coupling mechanism 502 need not include the lock 538. Thus, the bolt assembly 1300 can be implemented without the locking nut 1316.

Figure 14:
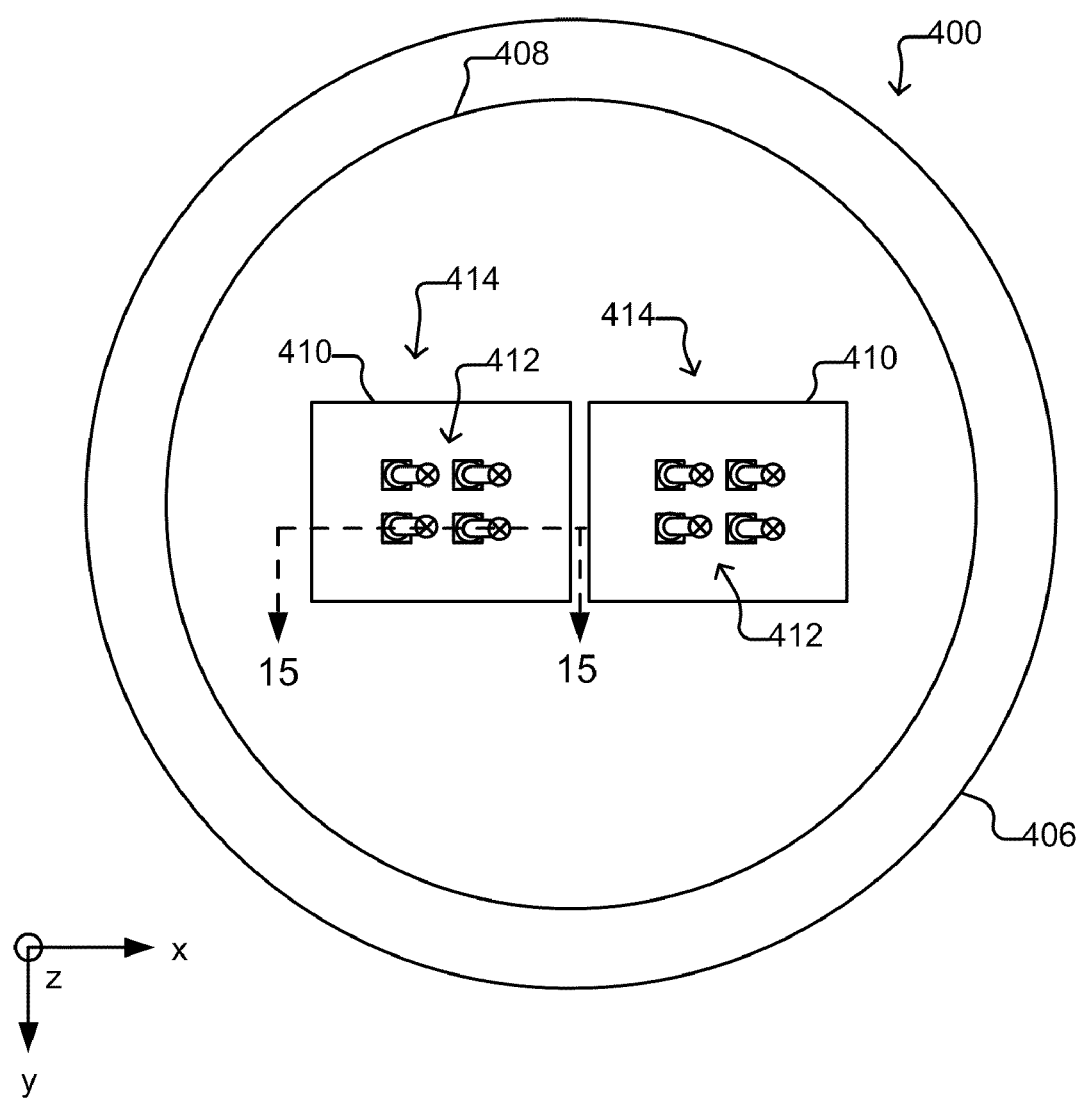
FIG. 14 illustrates a bottom view of the probe card assembly.
Figure 15:
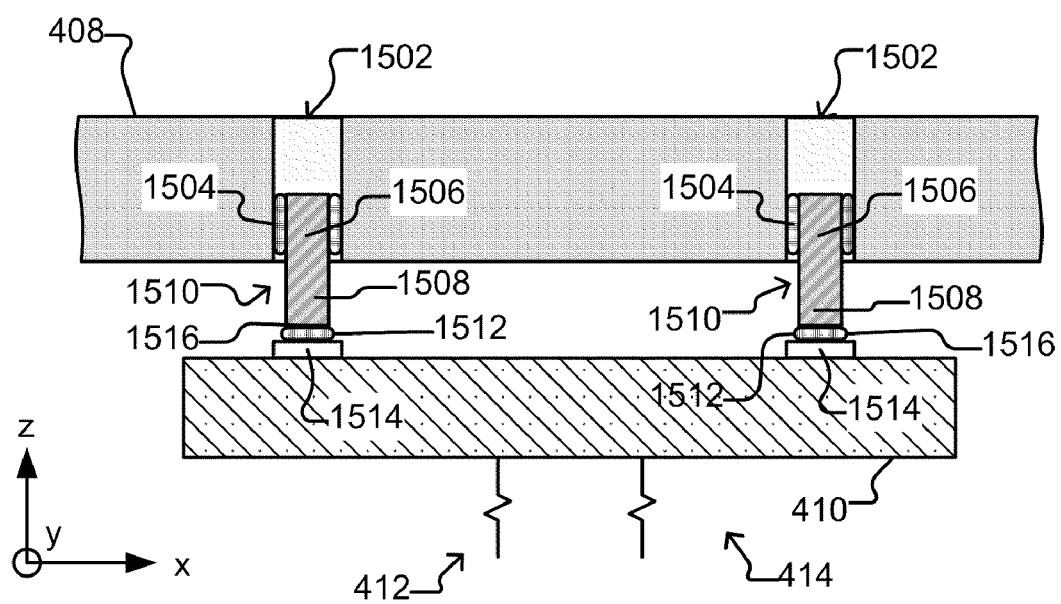
FIG. 15 illustrates an example of the non-adjustably fixed coupling mechanisms shown in FIGS. 5 and 6B.

FIG. 14 illustrates a bottom view of the probe card assembly 400, and FIGS. 15, 16, 17, 18, 19, 20, 21, 22, and 23 illustrate non-limiting examples of the non-adjustably fixed coupling mechanism 506. FIG. 15 illustrates one such example. FIG. 14 shows a bottom view of the probe card assembly 400, and FIG. 15 shows a simplified, cross-sectional side view that includes a partial view of the frame 408 and one probe assembly 414.

In FIG. 15, pins 1510 can couple the probe substrate 410 of a probe assembly 414 to the frame 408. A pin 1510 is thus a non-limiting example of the non-adjustably fixed coupling mechanism 506. Although two pins 1510 are shown, only one pin or more than two pins 1510 can couple a probe substrate 410 to the frame 408. For example, in some embodiments, four pins 1510 positioned symmetrically about the probe substrate 410 can couple the probe substrate 410 to the frame 408.

Figure 16:
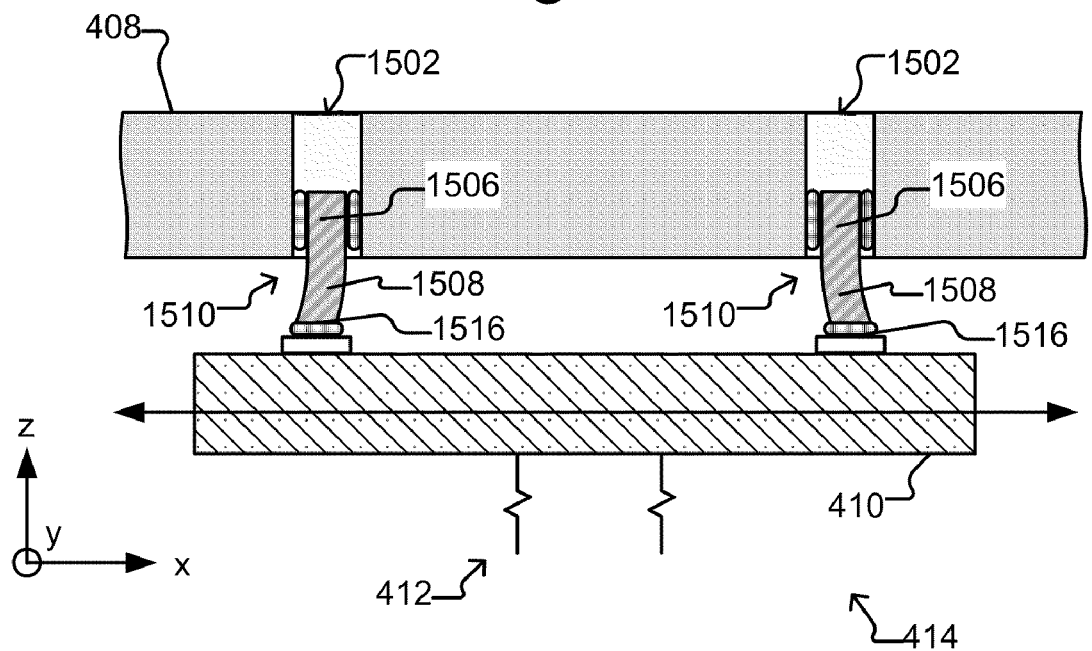
FIGS. 16 and 17 illustrate that the example of the non-adjustably fixed coupling mechanisms of FIG. 15 are flexible in the "x,y" plane.
Figure 17:
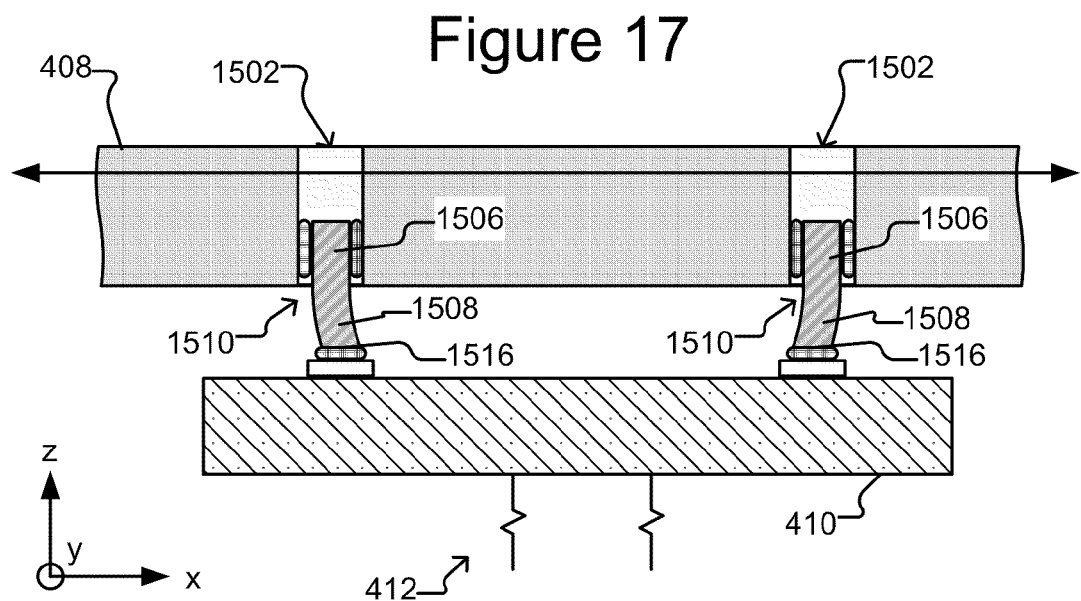

As shown in FIG. 15, a first end portion 1506 of each pin 1510 can be inserted into a hole 1502 in the frame 408. A joining material 1504 (e.g., solder, a brazing material, an adhesive (e.g., an epoxy), a material comprising nano-particles, a welding material, or a combination of any of the foregoing or other materials) can couple the first end portion 1506 to the hole 1502. A second end 1516 of each pin 1510 can be coupled by joining material 1512 (e.g., solder, a brazing material, an adhesive (e.g., an epoxy), a material compris- ing nano-particles, a welding material, or a combination of any of the foregoing or other materials) to a terminal 1514 on a probe substrate 410. The pin can be stiff in the "z" direction and flexible in the "x,y." As shown in FIGS. 16 and 17, the portions of the shafts 1508 of the pins 1510 that extend from the hole 1502 in the frame 408 can move (e.g., expand or contract) in the "x,y" plane in response to thermally induced relative motion between a probe substrate 410 and the frame 408. As discussed above, the expansion of contraction of the probe substrate 410 relative to the frame 408 can be from a particular location on the probe substrate 410.

The pin embodiment shown in FIGS. 14, 15, 16, and 17 is an example only, and variations are possible. For example, the shaft 1508 of the pin 1510 can be patterned to increase flexibility in the "x,y" plane. For example, the shaft 1508 can include one or more narrowed portions. As another example, the second end 1516 of the pin 1510 can be coupled directly to the probe substrate 410 rather than to the terminal 1514. As yet another example, the first end portion 1506 can be friction fit into the hole 1502 in the frame 408 and the joining material 1504 need not be used. FIGS. 18, 19, 20, 21, 22, and 23 illustrate other examples of modifications.

Figure 18:
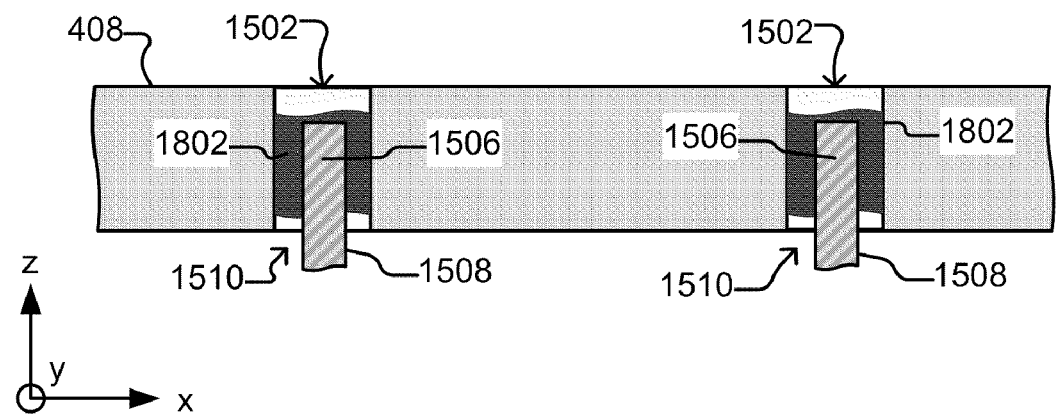
FIG. 18 illustrates a variation of the example shown in FIGS. 16 and 17 in which and end of the pin is embedded in a joining material in the hole in the frame.

FIG. 18 illustrates an embodiment in which the second end portion 1506 of the pin 1510 is embedded in a joining material 1802 (e.g., solder, a brazing material, an adhesive (e.g., an epoxy), a material comprising nano-particles, a welding material, or a combination of any of the foregoing or other materials) in the hole 1502 in the frame 408. As shown, the hole 1502 can be oversized with respect to the second end portion 1506 of the pin 1510.

Figure 19:
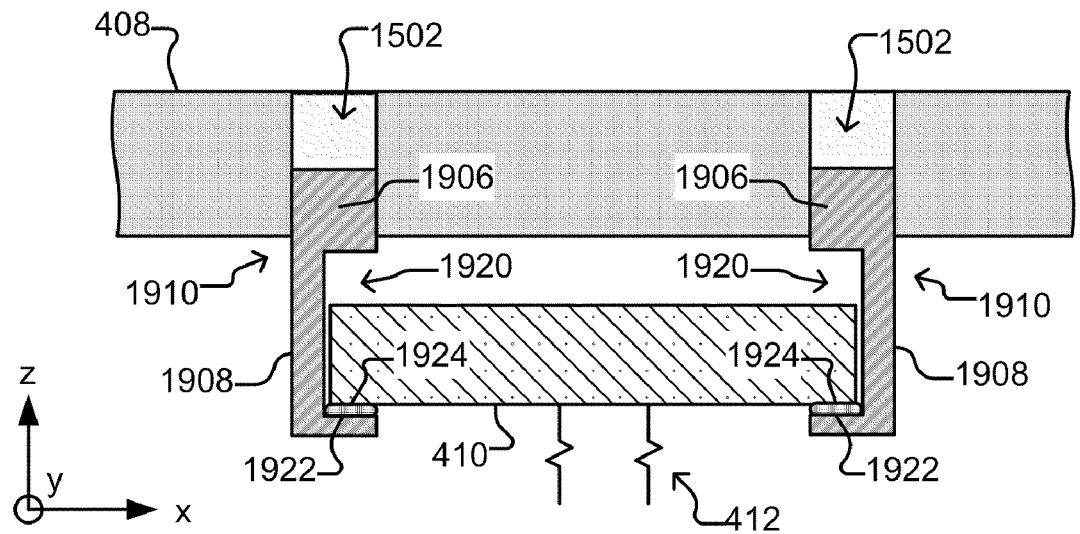
FIG. 19 illustrates another example of the non-adjustably fixed coupling mechanisms shown in FIGS. 5 and 6B.

FIG. 19 illustrates use of an alternative pin 1910 to couple a probe substrate 410 to the frame 408. As shown, the pin 1910 can have a shaft 1908 with a narrowed portion 1920, which can increase the flexibility of the pin 1910 in the "x,y" plane. Pin 1910 can include a support 1922 to which a probe substrate 410 is joined by a joining material 1924 (e.g., solder, a brazing material, an adhesive (e.g., an epoxy), a material comprising nano-particles, a welding material, or a combination of any of the foregoing or other materials). In some embodiments a joining material may not be required, and friction can be used to hold the probe substrate in place. Second end portions 1906 of the pins 1910 can be friction fit in the holes 1502 in the frame 408 or coupled by a joining material (not shown) to the holes 1502.

Figure 20:
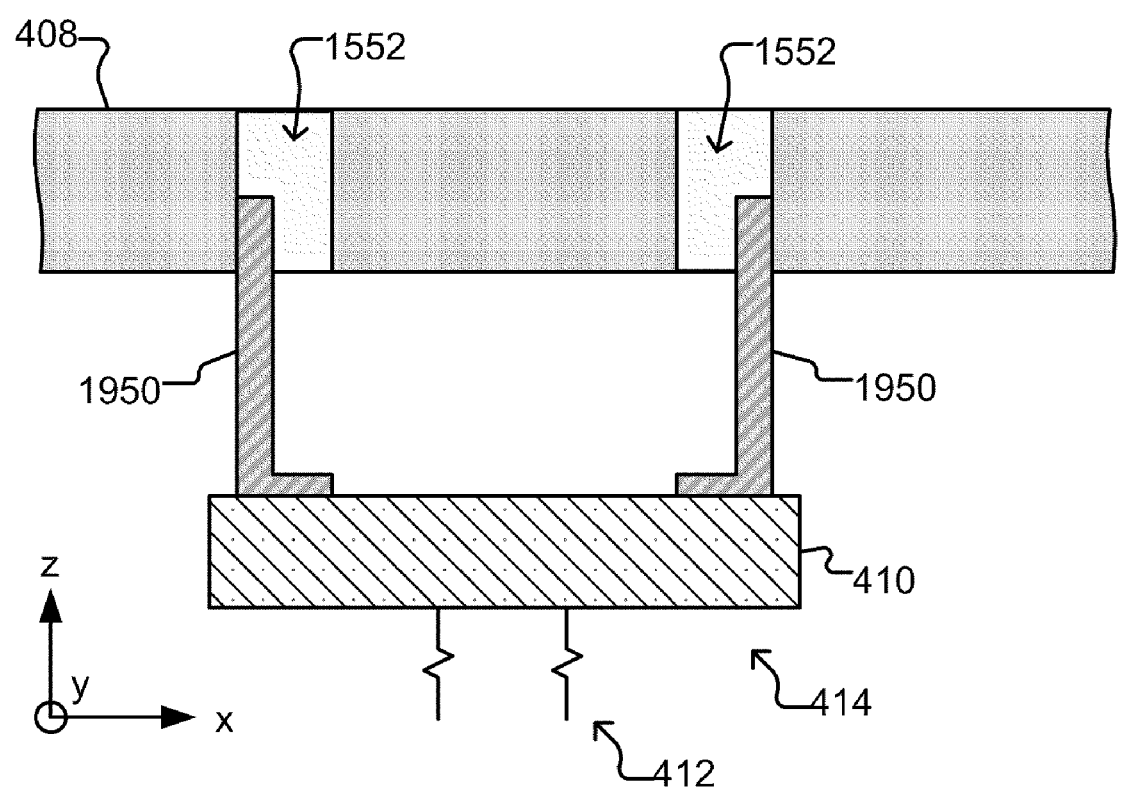
FIG. 20 illustrates an alternative example in the form of L-brackets of the non-adjustably fixed coupling mechanisms shown in FIGS. 5 and 6B.

FIG. 20 illustrates an embodiment in which the pins 1510 are replaced with L-brackets 1950, and holes 1502 in the frame 408 are replaced by slots 1552. As shown, one end the L-bracket 1950 can be coupled (e.g., by a joining material (not shown) like joining material 1504) to the inside of the slots 1952 in the frame 408. The slots 1952 can be shaped to receive the L-brackets 1950. The other end of the L-bracket 1950 can be coupled (e.g., by a joining material (not shown) like joining material 1504) to the probe substrate 410. The L-bracket 1950 can be stiff in the "z" direction and flexible in the "x,y" plane, allowing relative movement (e.g., due to thermal expansion or contraction) in the "x,y" plane between the probe substrate 410 and the frame 408 while impeding such movement in the "z" direction.

Note that multiple L-brackets 1950 can be used and oriented to achieve a desired ratio of flexibility in the "x,y" plane to stiffness in the "z" direction. L-brackets can be more flexible in one direction in the "x,y" plane (e.g., the "x" direction) than in a perpendicular direction in the "x,y" plane (e.g., the "y" direction). The number and orientation of the L-brackets 1950 that couple the probe substrate 410 to the frame 408 in FIG. 20 can be selected to achieve equal or approximately equal flexibility in both the "x" and the "y" directions in the "x,y" plane. For example, four L-brackets 1950 can couple the probe substrate 410 to the frame 408; two of the L-brackets 1950 can be oriented in a first direction (e.g., the "x" direction) and the other two L-brackets 1950 can be oriented in a second direction (e.g., the "y" direction) that is perpendicular to the first direction.

Figure 21:
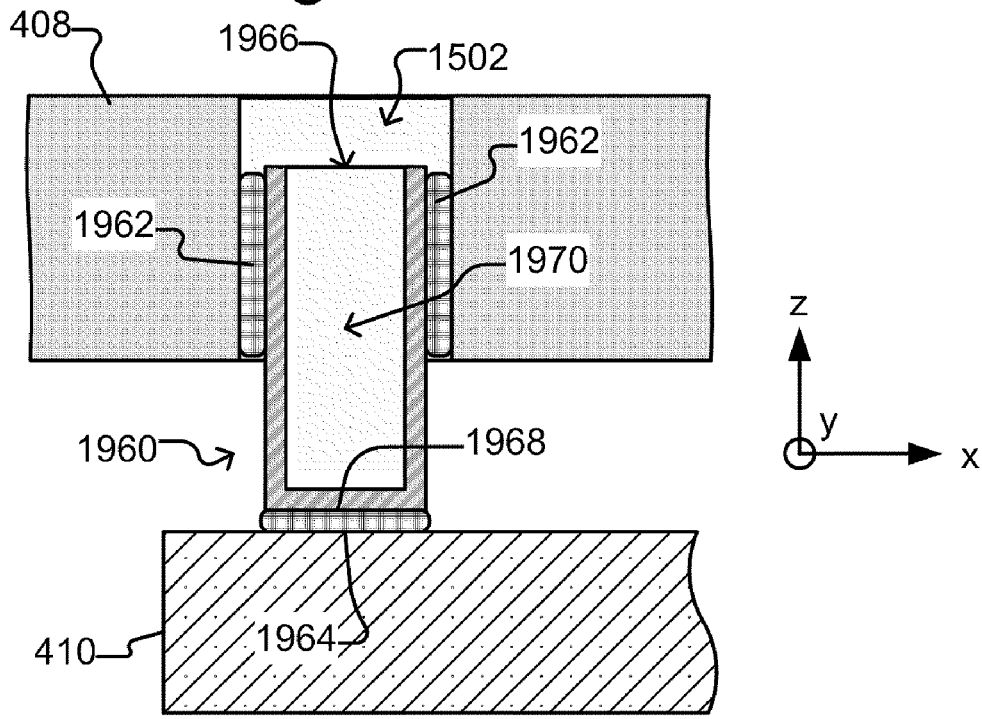
FIGS. 21 and 22 illustrate an alternative example in the form of a hollow pin of the non-adjustably fixed coupling mechanisms shown in FIGS. 5 and 6B.
Figure 22:
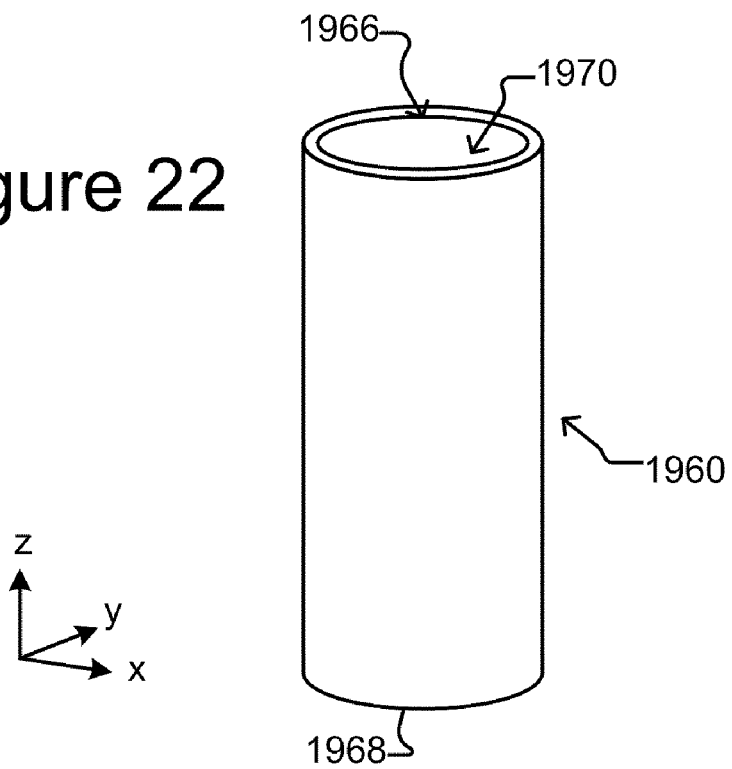

FIGS. 21 and 22 illustrate an embodiment in which each of the pins 1510 can be replaced with a can-shaped pin 1960. The pin 1960 can be shaped like a can that is open at a first end 1966 and closed at a second end 1968. The interior 1970 of the pin 1960 can be hollow. A portion of the pin 1960 adjacent the first end 1966 can be coupled (e.g., by joining material 1962, which can be like joining material 1504), to the interior of the hole 1502 in the frame 408, and the second end 1968 of the pin 1960 can be coupled (e.g., by joining material 1964, which can be like joining material 1512), to a probe substrate 410. The pin 1960 can be stiff in the "z" direction and flexible in the "x,y." As discussed, flexibility in the "x,y" plane can allow relative movement (e.g., due to thermal expansion or contraction) between the probe substrate 410 and the frame 408. In some embodiments, the pin 1960 can also be open at the second end 1968 and can thus be a tube.

Figure 23:
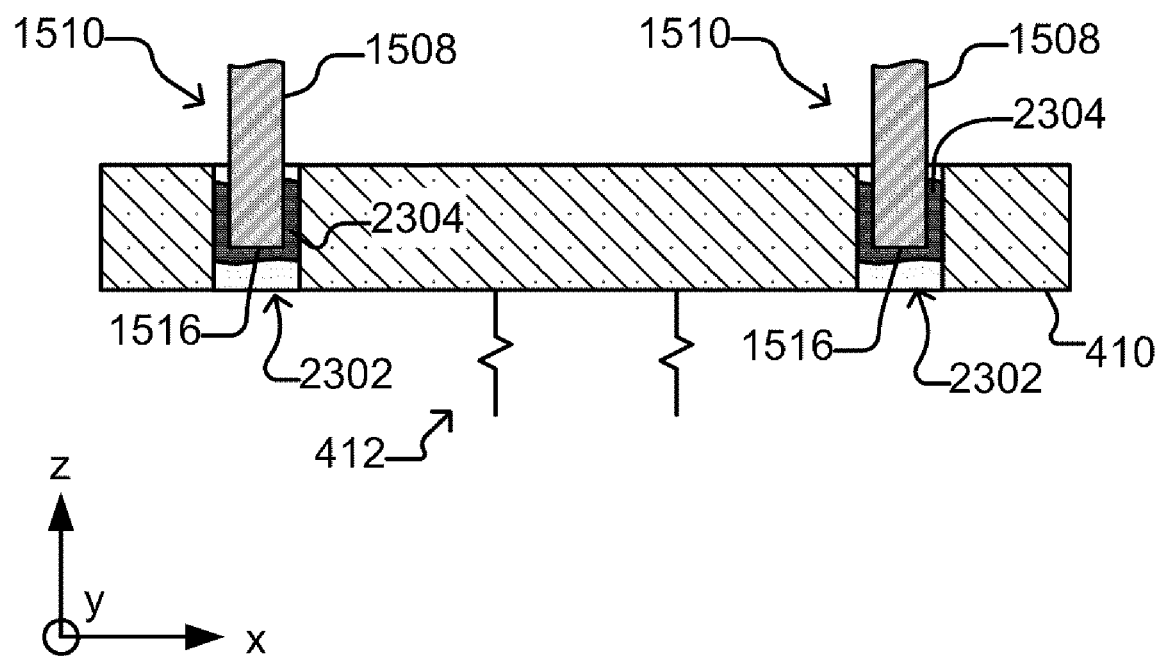
FIG. 23 illustrates a variation of the example shown in FIGS. 16 and 17 in which an end of the pin is coupled by a joining material to a hole in a probe substrate.

FIG. 23 illustrates an embodiment in which the second ends 1516 of the pins 1510 are inserted into holes 2302 in the probe substrate 410. As shown, a portion of each the pin 1516 adjacent the second end 1516 can be coupled to the interior of the hole 2302 by a joining material 2304, which can be like the joining material 1512 discussed above.

FIGS. 24 to 26 illustrate non-limiting examples of the coupling mechanism 504. FIG. 24 illustrates a bottom view of the wiring substrate 406 with includes alignment features 2402 (e.g., pins) that can extend from the wiring substrate 406. FIG. 25 illustrates a bottom view of the frame 408 with constraints 2502. FIG. 26 illustrates a bottom view of the wiring substrate 406 and the frame 408 in which the alignment features 2402 on the wiring substrate 406 are inserted into the constraints 2502 on the frame 408. Each pair of an alignment feature 2402 and a constraint 2502 is a non-limiting example of a coupling mechanism 504.

As mentioned, FIG. 24 is a bottom view of the wiring substrate 406 that shows a bottom surface of the wiring substrate 406, which is the surface on which the terminals 514 (see FIGS. 5 and 6B) are disposed. The alignment features 2402 can extend from the bottom surface of the wiring substrate. As also mentioned, FIG. 25 is a bottom view of the frame 408, which includes constraints 2502 for receiving the alignment features 2402. The frame 408 also includes openings 516 for interposers 518. The openings 516 can include bumps 2520 for positioning the interposers 518. For example, an interposer 518 can be positioned in the openings 516 by pressing the interposer 518 against the bumps 2520. Springs (not shown) on the interposer 518 and/or the frame 408 can bias the interposer 518 against the bumps 2520.

The alignment features 2402 can be positioned in predetermined locations on the wiring substrate 406 with respect to the terminals 514, and the constraints 2502 can be positioned in predetermined locations on the frame 408 with respect to the spring interconnects 526 of the interposers 518 while the interposers are positioned against bumps 2520 in the openings 516 such that when the alignment features 2402 are inserted into the constraints 2502 the spring interconnects 526 align with the terminals 514.

As shown in FIG. 25, each constraint 2502 can include an opening 2504 for receiving a corresponding alignment feature 2402. The opening 2504 can be undersized with respect to the alignment feature 2402, and the opening 2504 can include adjacent flexures 2506 that allow the opening 2504 to flex to accommodate the larger alignment feature 2402. Alternatively or in addition, each alignment feature 2402 can be flexible and thus flex in order to fit into a smaller opening 2504. The opening 2504 can be configured to allow alignment feature 2402 to move in one or more directions in the opening 2504. The constraints 2502 can be configured such that each constraint 2502 limits movement of its corresponding alignment feature 2402 to a single degree of movement, which is represented in FIGS. 25 and 26 by axes 2508. That is, movement of an alignment feature 2402 in an opening 2504 is limited to movement along the axis 2508. As shown in FIGS. 25 and 26, the group of all the constraints 2502 can be positioned such that all of the axes 2508 are directed at a location 2512 on the frame 408 and a corresponding location 2404 on the wiring substrate 406 while the alignment features 2402 are inserted into the constraints 2502 (as in FIG. 26). In some embodiments, the location 2404 can be a centroid of the terminals 514 on the wiring substrate 406, and the location 2512 can be a centroid of the spring interconnects 526 of the interposers 518 while each interposer 518 is positioned against the bumps 2520 in the openings 516 in the frame 408. The alignment features 2402 and constraints 2502 can allow relative expansion or contraction of the wiring substrate 406 and the frame 408 radially in the "x,y" plane with respect to locations 2512 and 2404 while impeding rotation of the wiring substrate 406 and/or the frame 408 about the "z" axis. This can keep the locations 2512 and 2404 generally aligned and also keep the terminals 514 on the wiring substrate 406 and the spring interconnects 526 of the interposers 518 in the openings 516 in the frame aligned. Alternatively, the constraints 2502 can be positioned such that the axes 2508 are directed at something other than the location 2512.

In some embodiments, the opening 2508 can be a slot that allows a corresponding alignment feature 2402 inserted in the slot to move along the length of the slot. In such an example, the length of the slot can be larger than the alignment feature 2402 while the width of the slot can be smaller than the alignment feature 2402. Each slot can be oriented such that its length points at the location 2512. One or more of the flexures can be portions of the frame 408 between the center slot and two side slots located adjacent the center slot.

The example shown in FIGS. 24-26 is not limiting, and variations are possible. For example, the alignment mechanisms 2402 can extend from the frame 408, and the constraints 2502 can be on the wiring substrate 406.

Although not shown in FIGS. 24-26, the coupling mechanisms 552 (see FIGS. 5 and 6B) can be implemented like the coupling mechanisms 504 in FIGS. 24-26 including all variations of the coupling mechanisms 504 discussed herein. For example, the coupling mechanisms 552 can comprise alignment features like the alignment features 2402 in FIGS. 24-26 except the alignment features of the coupling mechanisms 552 can extend from the opposite surface of the wiring substrate 406 toward the stiffener 402 (see FIGS. 5 and 6B). In some embodiments, the alignment features 2402 shown in FIG. 24 and the corresponding alignment features of the coupling mechanisms 552 that extend from the opposite surface of the wiring substrate 406 can comprise a single pin that passes through the wiring substrate 406 and extends from both sides of the wiring substrate 406. The coupling mechanism 552 can also include constraints that are like the constraints 2502 of the coupling mechanism 504 but are on the stiffener 402 rather than the frame 408. Otherwise, the coupling mechanisms 552 can be implemented like and can function like the coupling mechanisms 502 as illustrated in FIGS. 24-26.

FIG. 27 illustrates a non-limiting example of the second adjustable coupling mechanism 508 in the form of a bolt assembly 2700. FIG. 27 shows a simplified, partial view of a coupling arm 418 of the stiffener 402 and the mounting surface 110 of the housing 120 of the test system 100 of FIG. 1. The bolt assembly 2700 can be generally similar to the bolt assembly 1300 of FIG. 13.

FIG. 27 illustrates a non-limiting example of the second adjustable coupling mechanism 508 in the form of a bolt assembly 1300. (FIG. 27 shows a simplified, partial view of a coupling arm 418 of the stiffener 402 and the mounting surface 110 of the housing 120 of the test system 100 in FIG. 1.) As shown, the bolt assembly 2700 can include a shaft 2702, an adjustment nut 2714, a locking nut 2716, and a tightening nut 2712. Moreover, the shaft 2702 can include a threaded upper shaft 2704, a flexible middle portion 2706, and a threaded end portion 2708. The upper shaft 2704 can be threaded along all or at least a portion of the shaft so that the tightening nut 2712 can thread onto the shaft 2704. The middle portion 2706 can be patterned (not shown) to increase the flexibility in the "x,y" plane of the middle portion 2706. For example, the middle portion can include one or more narrowed sections (not shown).

As also shown, the coupling arm 418 can have a threaded upper hole 2720 and a lower oversized hole 2724 that align generally with a threaded hole 2722 in the mounting surface 110. The adjustment nut 2714 can be threaded and can thread into the threaded upper hole 2720 in the coupling arm 418. Turning the adjustment nut 2714 one direction can move the adjustment nut 2714 toward the mounting surface 110, and turning the adjustment nut 1314 the opposite direction can move the adjustment nut 2714 away from the frame 408. Thus, the position of a lower end 2732 of the adjustment nut 2714 can be positioned by turning the adjustment nut 2714. The locking nut 2716 can lock the adjustment nut 2714 in place. Thus, the adjustment nut 2714 can be turned only while the locking nut 2716 is unlocked but cannot be turned (with reasonable of typical force) in either direction while the locking nut 2716 is locked. The lower end 2732 of the adjustment nut 2714 can thus be positioned to and locked in a desired location.

As also shown, the threaded end portion 2708 of the shaft 2702 can thread into the threaded hole 2722 in the mounting surface 110, and the flexible middle portion 2706 can be in the oversized hole 2724 in the coupling arm 418. The upper shaft 2704 can pass through a hole 2728 in the adjustment nut 2714. As mentioned, the upper shaft 2704 can be threaded so that the tightening nut 2712 can thread onto the shaft 2704. The hole 2728 in the adjustment nut 2714, however, is not threaded. Thus, the upper shaft 2704 of the shaft 2702 can move in the "z" direction (e.g., up and down) within the hole 2728. Threading the tightening nut 2712 onto the upper shaft 2704 of the shaft 2702 and tightening the tightening nut 2712 against the adjustment nut 2714, pulls the upper shaft 2704 of the shaft 2702—and thus the shaft 2702—upward through the hole 2728 until the shoulder 2718 of the shaft 2702 contacts the lower end 2732 of the adjustment nut 2714. The position of the adjustment nut 2712—or more specifically, the position of the lower end 2732 of the adjustment nut 2712—thus determines the distance between the coupling arm 418 and the part of the mounting surface 110 where the threaded hole 2722 is located.

As mentioned, the bolt assembly 2700 can be an example of the second adjustable coupling mechanism 508 in FIGS. 4, 6, 10, 11, and 12. A bolt assembly 2700 can thus replace each of the second adjustable coupling mechanisms 502 in those figures. In accordance with the description above of FIGS. 10 and/or 11, one or more of the second adjustable coupling mechanisms 508 in FIGS. 10 and/or 11—each implemented as a bolt assembly 2700 of FIG. 27—can be used to set an individually selected distance between the coupling arms 418 of the stiffener 402 and part of the mounting surface 110 as described above with regard to FIG. 27 and thereby effect a desired tilt of the probe card assembly 400 with respect to the mounting surface 110 as illustrated in FIG. 10 and/or change the shape of the major surface 534 of the frame 408 as illustrated in FIG. 11.

The bolt assembly 2700 of FIG. 27 can be operated in generally the same way as the bolt assembly 1300 of FIG. 13. For example, each of the bolt assemblies 2700 can be operated as follows. The tightening nut 2712 can be loosened or removed, and the locking nut 2716 can be unlocked. The adjusting nut 2714 can then be turned until the lower end 2732 of the shaft 2702 is positioned such that the distance between the coupling arm 418 and the part of the mounting surface 110 where the lower hole 2722 is located will be a desired distance. The locking nut 2716 can then be locked, which as discussed above, prevents the adjustment nut 2712 from being turned and thus locks the position of the lower end 2732. The tightening bolt 2712 can be threaded onto the upper shaft 2704 of the shaft 1302 and tightened against the adjustment nut 2714, which as discussed above, pulls the shoulder 2718 of the shaft 2702 against the lower end 2732 of the adjustment nut 2714. As shown in FIGS. 4 and 6 and discussed above, a plurality of second adjustable coupling mechanisms 508 can couple the coupling arms 418 to the mounting surface 110, and each such second adjustable coupling mechanism 508 can be implemented as the bolt assembly 2700 shown in FIG. 27. As discussed above, by operating one or more of such bolt assemblies 2700 as discussed above, the tilt of the stiffener 402—and thus the prober card assembly 400—can be changed with respect to the mounting surface 110 as illustrated in FIG. 10 and/or the shape of the major surface 534 of the frame 408 can be changed as illustrated in FIG. 11.

Thereafter, the stiffener 402—and thus the probe card assembly 400—can be removed and replaced by operating each bolt assembly 2700 as follows. The tightening nut 2712 can be removed, allowing the coupling arms 418 to be pulled away from the shaft 2702. Each of the coupling arms 418—and thus the probe card assembly 400—can thus be removed from the mounting surface 110. The locking nut 2716 need not, however, be unlocked. Consequently, the lower end 2732 of the adjustment nut 2714 will remain in the same location. The probe card assembly 400 can be coupled to the mounting surface 110 by positioning the coupling arms 418 such that the upper shaft 2704 of each shaft 2702 threaded into a hole 2722 in the mounting surface 110 is inserted into the hole 2728 in a corresponding adjustment nut 2714 and then threading a tightening nut 2712 onto the upper shaft 2704 of the shaft 2702 and tightening the tightening nut 2712 against the adjustment nut 2714. Because the position of the lower end 2732 of each of the adjustment nuts 2714 was not changed, the tilt of the probe card assembly 400 and/or the shape of the major surface 534 of the frame 408 will be approximately the same as before the probe card assembly 400 was removed.

As mentioned, the bolt assembly 2700 is an example of the second adjustable coupling mechanism 508 shown in FIGS. 5 and 6B. Moreover, the locking nut 2716 is an example of the lock 542, and the adjustment nut 2714 is an example of the adjustor 540 in FIGS. 5 and 6B. It is noted that, while the locking nut 2716 is locked, each bolt assembly 2700 can be stiff in the "z" direction while being simultaneously flexible in the "x,y" plane as illustrated in FIG. 12 and discussed above. As mentioned above, the flexible shaft portion 2706 of each shaft 2702 can be flexible in the "x,y" plane.

Figure 28:
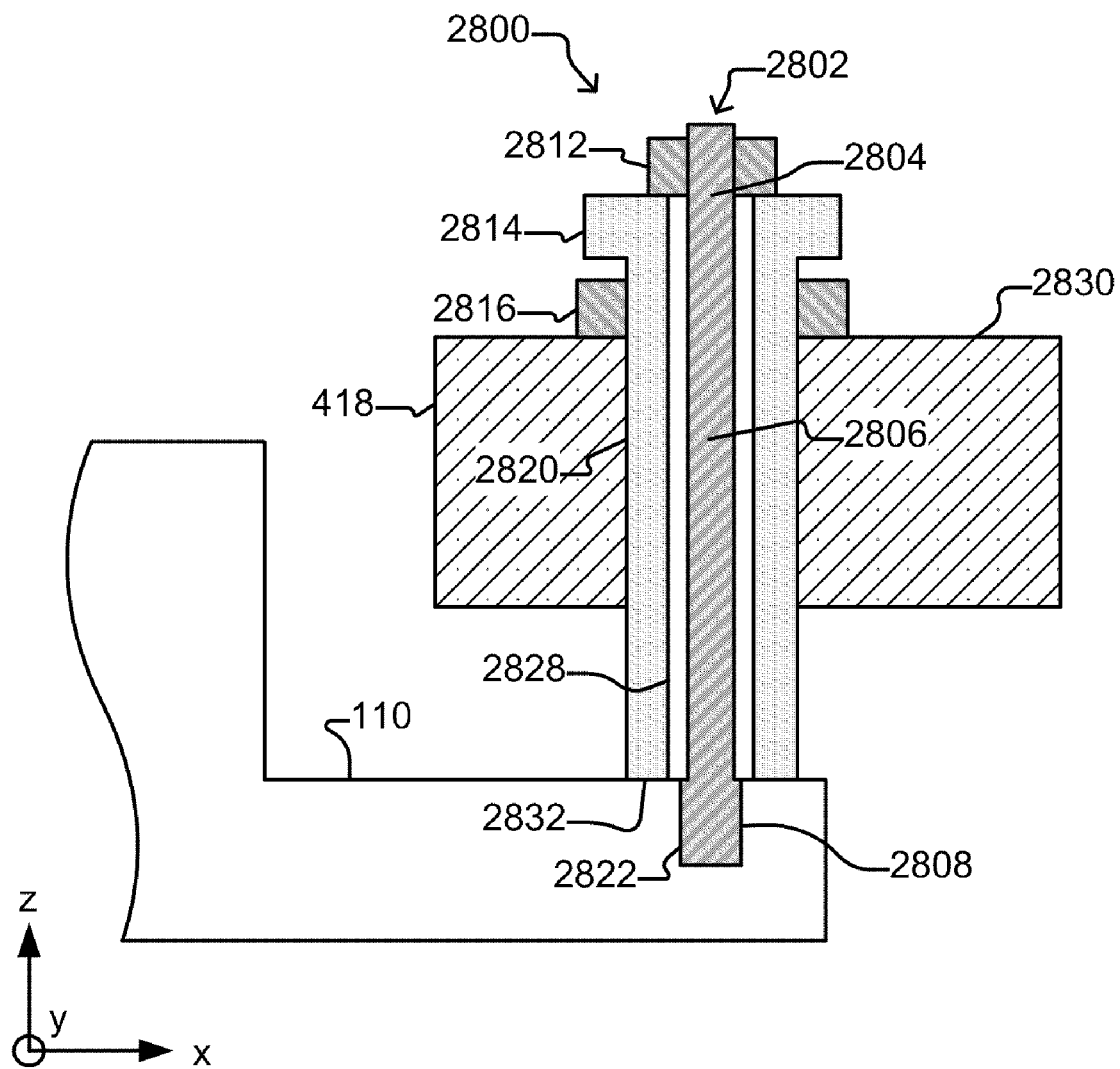
FIG. 28 illustrates another example of the second adjustable coupling mechanisms of FIGS. 5 and 6B.

FIG. 28 illustrates another non-limiting example of the first adjustable coupling mechanism 502 or the second adjustable coupling mechanism 508 in the form of a bolt assembly 2800. In the discussion that follows, the bolt assembly 2800 is described in terms of an implementation of the second adjustable coupling mechanism 508, but it is to be understood that the first adjustable coupling mechanism 502 can be configured generally like the bolt assembly 2800. (FIG. 28 shows a simplified, partial view of a coupling arm 418 and the mounting surface 110 of the housing 120 of the test system 100 in FIG. 1.) As shown, the bolt assembly 2800 can include a shaft 2802, an adjustment nut 2814, a locking nut 2816, and a tightening nut 2812. Moreover, the shaft 2802 can include a threaded upper shaft 2804, a flexible middle portion 2806, and a threaded end portion 2808. The upper shaft 2804 can be threaded along all or at least a portion of the shaft so that the tightening nut 2812 can thread onto the shaft 2804. In some embodiments the tightening nut 2812 and the upper shaft 2804 can be a single structure.

As also shown, the coupling arm 418 can have a threaded hole 2820 that aligns generally with a threaded hole 2822 in the mounting surface 110. The adjustment nut 2814 can be threaded and can thread into the threaded hole 2820 in the coupling arm 418. Turning the adjustment nut 2814 in one direction can move the adjustment nut 2814 toward the mounting surface 110, and turning the adjustment nut 1314 in the opposite direction can move the adjustment nut 2814 away from the mounting surface 110. Thus, the position of a lower end 2832 of the adjustment nut 2814 can be positioned by turning the adjustment nut 2814. The locking nut 2816 can lock the adjustment nut 2814 in place. Thus, the adjustment nut 2814 can be turned only while the locking nut 2816 is unlocked but cannot be turned (with reasonable or typical force) in either direction while the locking nut 2816 is locked. The lower end 2832 of the adjustment nut 2814 can thus be positioned to and locked in a desired location.

As also shown, the threaded end portion 2808 of the shaft 2802 can thread into the threaded hole 2822 in the mounting surface 110, and the flexible shaft portion 2806 and the upper shaft 2804 of the shaft 2802 can pass through a hole 2828 in the adjustment nut 2814. As mentioned, the upper shaft 2804 can be threaded so that the tightening nut 2812 can thread onto the shaft 2804. The hole 2828 in the adjustment nut 2814, however, is not threaded. Thus, the upper shaft 2804 of the shaft 2802 can move in the "z" direction (e.g., up and down) within the hole 2828. Threading the tightening nut 2812 onto the upper shaft 2804 of the shaft 2702 and tightening the tightening nut 2812 against the adjustment nut 2814, pushes the lower end 2832 of the shaft 2802 against the mounting surface 110. The position of the adjustment nut 2812—or more specifically, the position of the lower end 2832 of the adjustment nut 2812—thus determines the distance between the stiffener 402 and the part of the mounting surface 110 where the threaded hole 2822 is located.

As mentioned, the bolt assembly 2800 can be an example of the second adjustable coupling mechanism 508 in FIGS. 4, 6, 10, 11, and 12. (As also mentioned, the first adjustable coupling mechanism 502 can also be implemented generally like the bolt assembly 2800.) A bolt assembly 2800 can thus replace each of the second adjustable coupling mechanisms 502 in those figures. In accordance with the description above of FIGS. 10 and/or 11, one or more of the second adjustable coupling mechanisms 508 in FIGS. 10 and/or 11—each implemented as a bolt assembly 2800 of FIG. 28—can be used to set an individually selected distance between each of the coupling arms 418 and part of the mounting surface 110 as described above with regard to FIG. 28 and thereby effect a desired tilt of the probe card assembly 400 with respect to the mounting surface 110 as illustrated in FIG. 10 and/or change the shape of the major surface 543 of the frame 408 as illustrated in FIG. 11.

The bolt assembly 2800 of FIG. 28 can be operated generally like the bolt assembly 1300 of FIG. 13. For example, each of the bolt assemblies 2800 can be operated as follows. The tightening nut 2812 can be loosened or removed, and the locking nut 2816 can be unlocked. The adjusting nut 2814 can then be turned until the lower end 2832 of the shaft 2802 is positioned such that the distance between the stiffener 402 and the part of the mounting surface 110 where the hole 2822 is located will be a desired distance. The locking nut 2816 can then be locked, which as discussed above, prevents the adjustment nut 2812 from being turned and thus locks the position of the lower end 2832. The tightening bolt 2812 can then be threaded onto the upper shaft 2804 of the shaft 1302 and tightened against the adjustment nut 2814, which pushes the lower end 2832 of the adjustment nut 2814 against the mounting surface 110. As shown in FIGS. 4 and 6 and discussed above, a plurality of second adjustable coupling mechanisms 508 can couple the coupling arms 418 to the mounting surface 110, and each such second adjustable coupling mechanism 508 can be implemented as the bolt assembly 2800 shown in FIG. 28. By operating one or more of such bolt assemblies 2800 as discussed above, the tilt of the probe card assembly 400 with respect to the mounting surface 110 can be changed as illustrated in FIG. 10 and/or the shape of the major surface 534 of the 408 frame can be changed as illustrated in FIG. 11.

Thereafter, the stiffener 402—and thus the probe card assembly 400—can be removed and replaced by operating each bolt assembly 2800 as follows. The tightening nut 2812 can be removed, allowing the coupling arms 418 to be pulled away from the shaft 2802. Each of the coupling arms 418—and thus the probe card assembly 400—can thus be removed from the mounting surface 110. The locking nut 2816 need not, however, be unlocked. Consequently, the lower end 2832 of the adjustment nut 2814 will remain in the same location. The probe card assembly 400 can be coupled to the mounting surface 110 by positioning the coupling arms 418 such that the upper shaft 2804 of each shaft 2802 threaded into a hole 2822 in the mounting surface 110 is inserted into a hole 2828 in a corresponding adjustment nut 2814 and then threading a tightening nut 2812 onto the upper shaft 2804 of the shaft 1302 and tightening the tightening nut 2812 against the adjustment nut 2814. Because the position of the lower end 2832 of each of the adjustment nuts 2814 was not changed, the tilt of the probe card assembly 400 with respect to the mounting surface 110 and/or the shape of the major surface 534 of the frame 408 will be approximately the same as before the probe card assembly 400 was removed.

As mentioned, the bolt assembly 2800 is an example of the second adjustable coupling mechanism 508 shown in FIGS. 5 and 6B. Moreover, the locking nut 2816 is an example of the lock 542, and the adjustment nut 2814 is an example of the adjustor 540 in FIGS. 5 and 6B. It is noted that, while the locking nut 2816 is locked, each bolt assembly 2800 can be stiff in the "z" direction while being simultaneously flexible in the "x,y" plane as illustrated in FIG. 12 and discussed above. As mentioned above, the flexible shaft portion 2806 of each shaft 2802 can be flexible in the "x,y" plane.

It is noted that flexibility in the "x,y" plane can be provided in FIGS. 27 and 28 by providing flexures (not shown) in the mounting surface 110 adjacent the threaded hole 2722 in FIG. 27 or the threaded hole 2822 in FIG. 28. Such flexures (not shown) can allow the portion of the mounting surface 110 where the threaded hole 2722 or 2822 is located to move in one or more directions in the "x,y" plane. For example, one or more slots (not shown) in the form of elongate holes (not shown) in the mounting surface 110 can be provided adjacent the threaded hole 2722 in FIG. 27. These slots (not shown) can be sufficiently close to the threaded hole 2722 that the material of the mounting surface 110 between the threaded hole 2722 and each of the slots (not shown) can flex and can thus be flexures that allow the portion of the mounting surface 110 in which the threaded hole 2722 is located to move in one or more directions in the "x,y" plane. Slots (not shown) can similarly be provided in the mounting surface 110 adjacent the threaded hole 2822 in FIG. 28, and the portions of the mounting surface 110 between the threaded hole 2822 and the slots (not shown) can be flexures (not shown) that allow the portion of the mounting surface 110 in which the threaded hole 2822 is located to move in one or more directions in the "x,y" plane. Alternatively or additionally, these flexures can be made in the stiffener 402 near the hole 2720 in FIG. 27 or the hole 2820 in FIG. 28.

Figure 29:
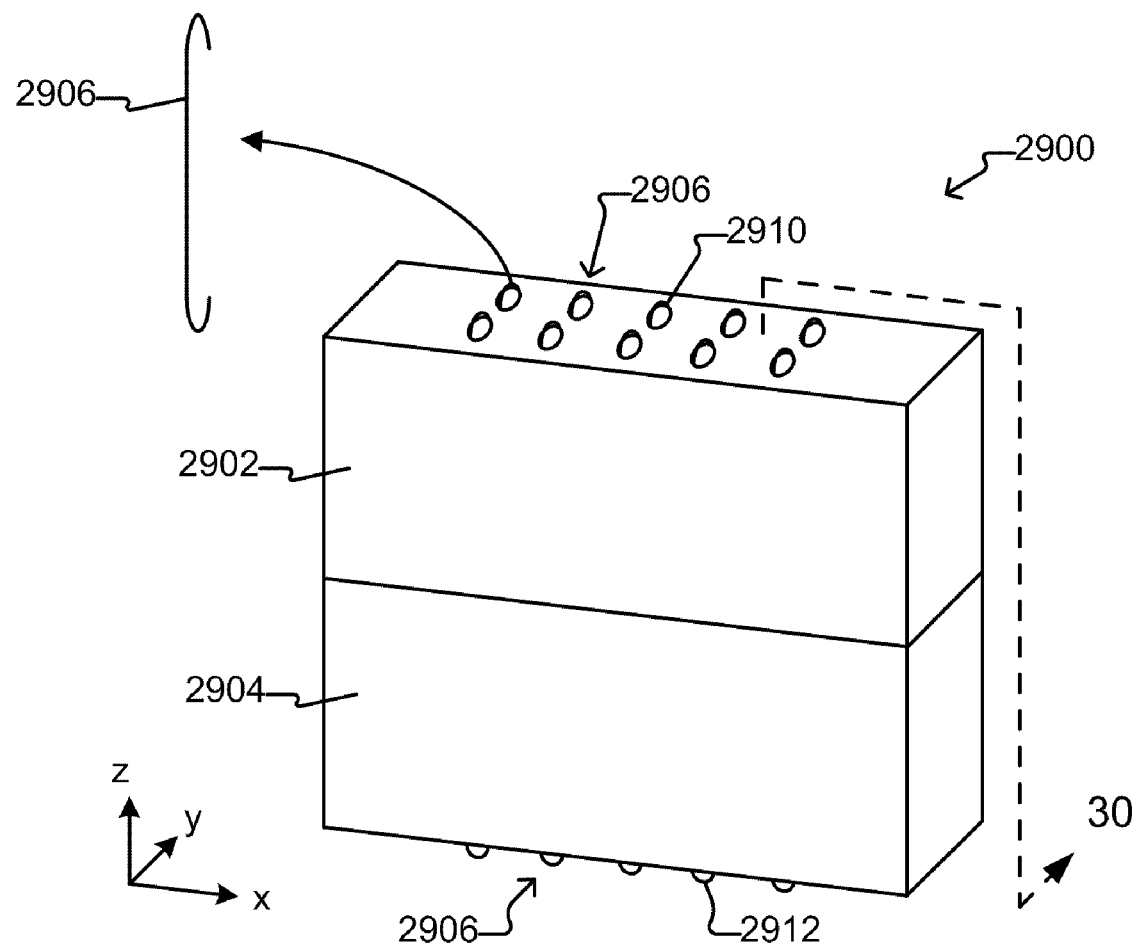
FIGS. 29, 30, and 31 illustrate an alternative embodiment of the interposer of FIGS. 5 and 6A.
Figure 30:
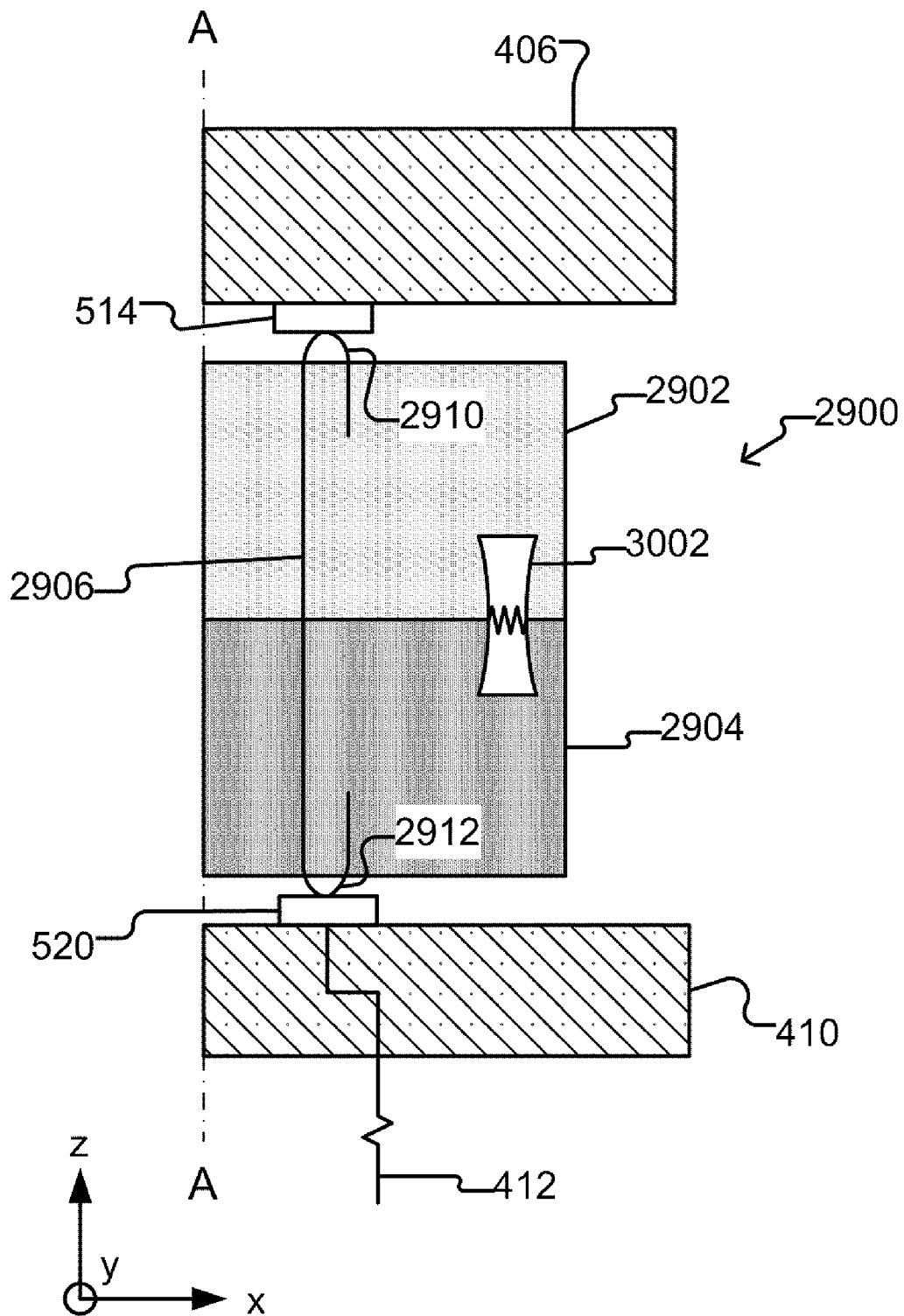
Figure 31:
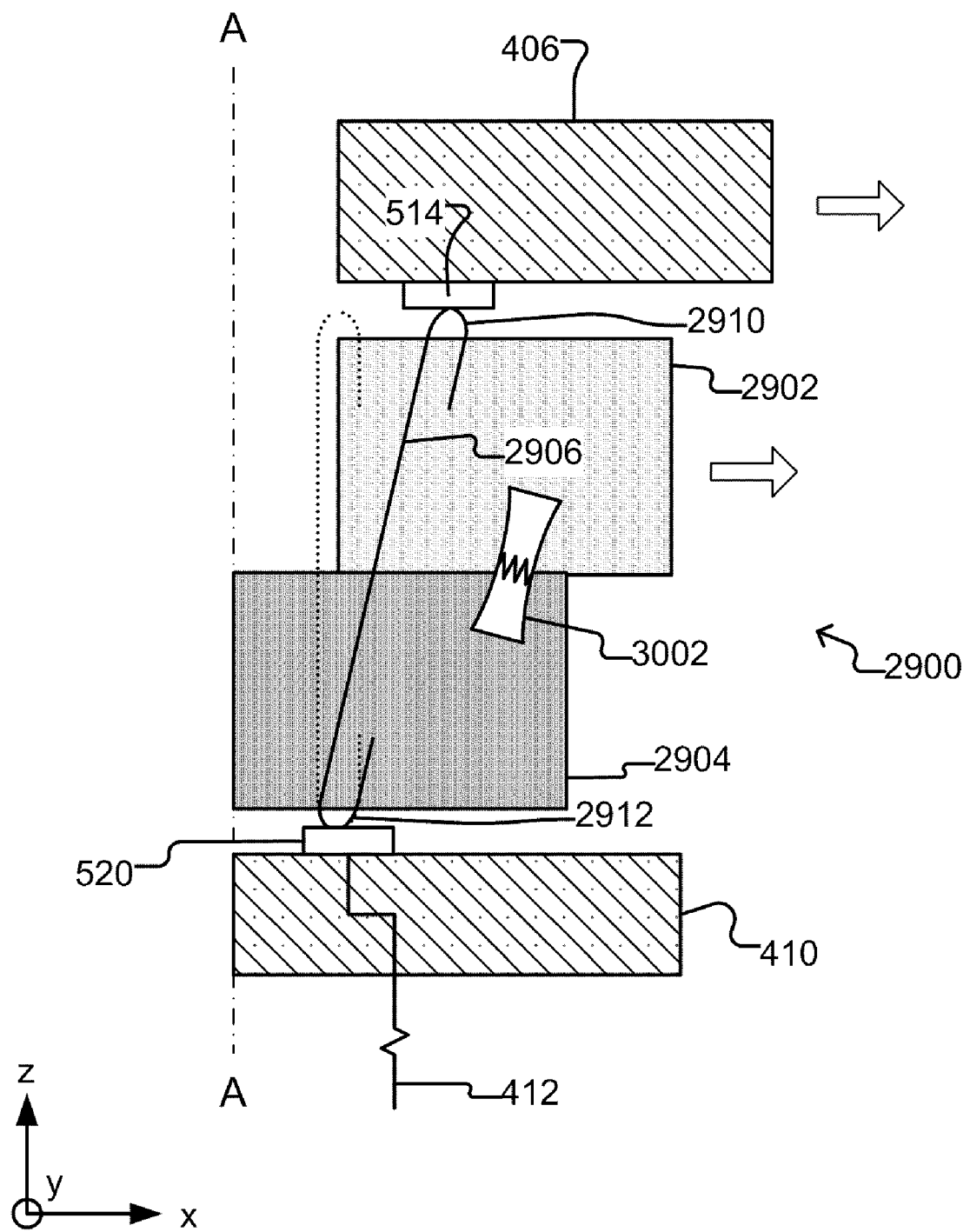

FIGS. 29, 30, and 31 illustrate an alternative exemplary embodiment of the interposers 518 of FIGS. 5 and 6A according to some embodiments of the invention. The interposer 2900 illustrated in FIGS. 29, 30, and 31 can replace the interposer 518 in the probe card assembly 400 of FIGS. 4, 5, and 6. As will be seen, the interposer 2900 can reduce shear force coupling between the wiring substrate 406 and a probe substrate 408.

As shown in FIG. 29, the interposer 2900 can include a first interposing layer 2902 and a second interposing layer 2904 disposed one on another. The first interposing layer 2902 can have a plurality of through holes (not shown in the figure) substantially in alignment with the through holes (not shown in the figure) in the second interposing layer 2904. A plurality of interconnection structures 2906 can be inserted into the holes (not shown) through the first and second interposing layers 2902 and 2904. Each of the interconnection structures 2906 can have a first end 2910 (comparable to a spring interconnect 526 of the interposer 518 in FIGS. 5 and 6A) extending from the first interposing layer 2902 and capable of forming an electrical contact with a terminal 514 on the first wiring substrate 406. Each of the interconnection structures 2906 can also include a second end 3012 (comparable to a spring interconnect 528 of the interposer 518 in FIGS. 5 and 6A) extending from the second interposer layer 2904 and capable of forming an electrical contact with a terminal 520 on a probe substrate 420.

Note that although the first and second interposing layers 2902 and 2904 are shown touching in FIG. 29, in some embodiments of the invention, there can be a space between them. Moreover, in some embodiments of the invention, the interposer 2900 can include more than two interposing layers. For example, the interposer 2900 can include three vertically stacked interposing layers. Likewise, these multiple interposing layers can be spaced apart from or immediately adjacent to each other. In some other embodiments of the invention, the interposer 2900 can be a single layer structure including one or more cutouts or flexures between its top and bottom surfaces to reduce shear force coupling from one surface thereof to another.

FIGS. 30 and 31 illustrate partial cross-sectional views illustrating the interposer 2900 between the wiring substrate 406 and a probe substrate 410 and how the interposer 2900 can reduce shear force coupling between the wiring substrate 406 and a probe substrate 410 in accordance with some embodiments of the invention. As shown, the first end 2910 of the interconnection structure 2906 can contact and form an electrical connection with a terminal 514 of the wiring substrate 406, and the second end 2912 can contact and form an electrical connection with a terminal 520 on one of the probe substrates 410.

The first and second interposing layers 2902 and 2904 can be coupled by one or more coupling mechanisms 3002 that are flexible in the "x,y" plane and thus allow relative movement between the first and second interposing layers 2902 and 2904. For example, each of the coupling mechanisms 3002 can comprise a pin similar to pin 1510 in FIG. 15 that is flexible in the "x,y" plane. The first and second interposing layers 2902 and 2904 can thus function as a decoupling structure that reduces shear force coupling between the wiring substrate 406 and a probe substrate 410 such that contact between the first end 2910 and a terminal 514 on the wiring substrate 406 and between the second end 2912 and a terminal 520 on a probe substrate can be maintained.

For example, consider movement of the wiring substrate 406 in the "x,y" plane as allowed by the non-adjustably fixed coupling mechanisms 404 as discussed above with respect to FIGS. 5 and 6B. Such movement can induce through the interposer 2900 a shear force between the wiring substrate 406 and the probe substrate 410. The interposer 2900 can be configured to, among other things, reduce such a shear force. The interposer 2900 can be designed as a decoupling structure where the first and second interposing layers 2902 and 2904 can move along with the wiring substrate 406 and the probe substrate 410, respectively. As shown in the difference between FIG. 30 and FIG. 31, as the wiring substrate 406 moves or expands to the right with respect to a reference line A-A, the first interposing layer 2902 can move along with the first wiring substrate 406 by means of friction there between. Because the second interposing layer 2904 can be decoupled from the first interposing layer 2902, the interposer 2900 as a whole can be more compliant in the "x,y" plane than it would have been, had the top surface of the interposing layer 2902 adjacent to the wiring substrate 406 and the bottom surface of the interposing layer 2904 adjacent to the probe substrate 410 been a uniform body of material. Thus, the first and second interposing layers 2902 and 2904 can function as, among other things, a decoupling structure for reducing shear force coupling between the top surface of the first interposing layer 2902 and the bottom surface of the second interposing layer 2904 to an extent greater than it would have been reduced, had the two surfaces been a uniform body of material. As a result, the interconnection structure 2906 can deflect from its original position shown in FIG. 29 and indicated by a broken line in FIG. 31 to a new position indicated by a solid line in FIG. 31, and still remain in electrical connection with the terminal 514 on the wiring substrate 406 and the terminal 520 a probe substrate 410. Additionally, because the first interposing layer 2902 follows the motion of the terminal 514 and the second interposing layer 2904 follows the motion of the terminal 520, interconnect structures 2906 of the interposer 2900 can be placed in tighter pitches. Since the second interposing layer 2904 can remain approximately stationary with respect to the frame 408 (not shown in FIG. 31 even as the wiring substrate 406 moves with respect to the frame, the probe substrate 410 coupled to the second interposing layer 2904 can remain stationary with respect to the frame 408, thereby ensuring a probe 412 coupled to the probe substrate 410 does not move with respect to the frame 408 and therefore remains in electrical contact with a terminal 116 of the DUTs 118 (see FIG. 1).

Figure 32:
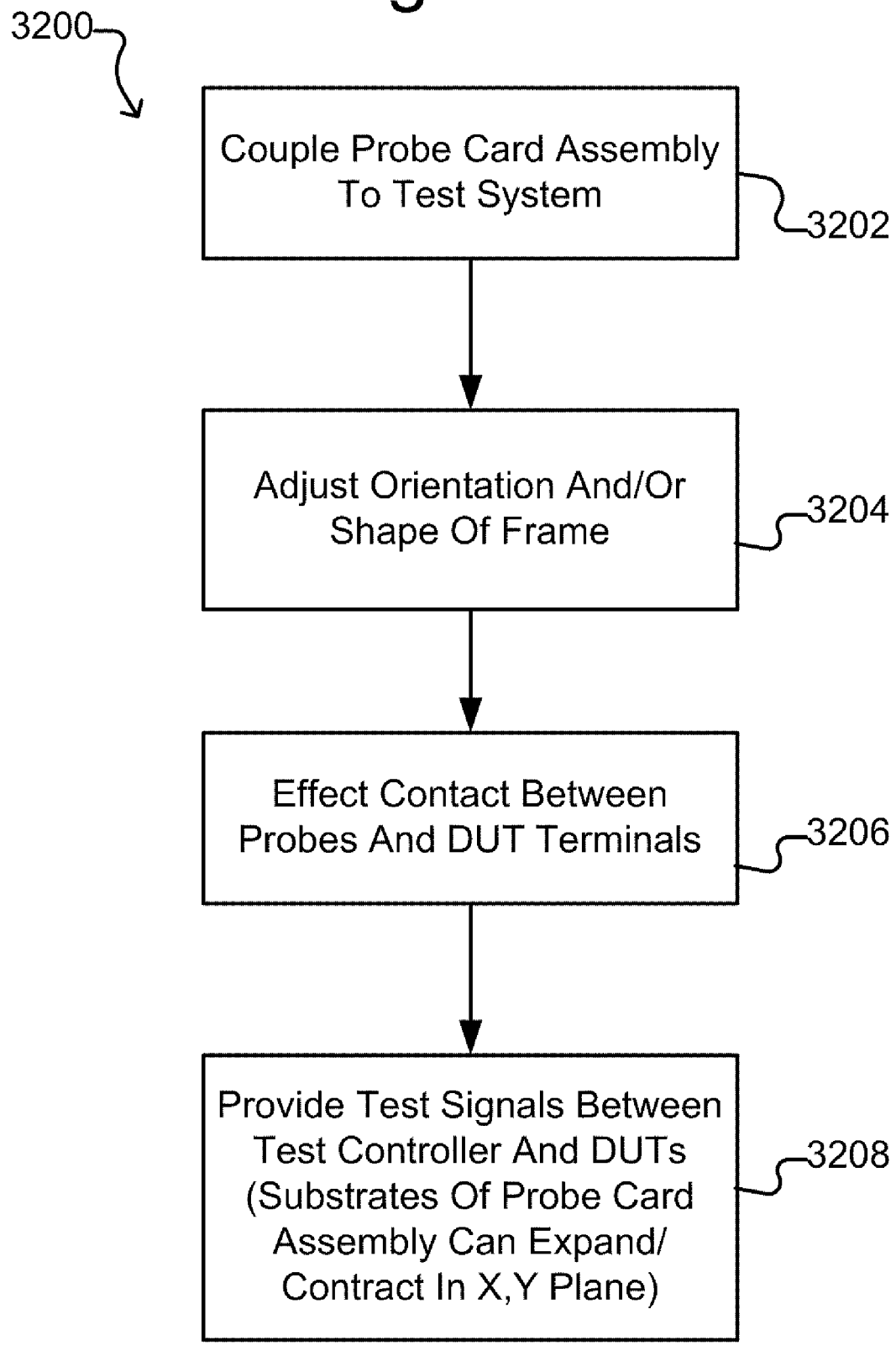
FIG. 32 illustrates a process for testing DUTs using the probe card assembly of FIG. 4 according to some embodiments of the invention.

As mentioned, the probe card assembly 400 of FIGS. 4, 5, and 51 (with any of the embodiments, examples, or modifications illustrated or discussed herein) can be used to test electronic devices. For example, the probe card assembly 400 can replace the probe card assembly 112 in the test system 100 of FIG. 1 and can thus be used to test DUTs 118. FIG. 32 illustrates a process 3200 of testing electronic devices. Although the process 3200 is not limited to use in a test system like the test system 100 of FIG. 1 to test DUTs 118, for ease of discussion and illustration, the process 3200 will be discussed herein with respect to the test system 100 of FIG. 1.

Figure 33:
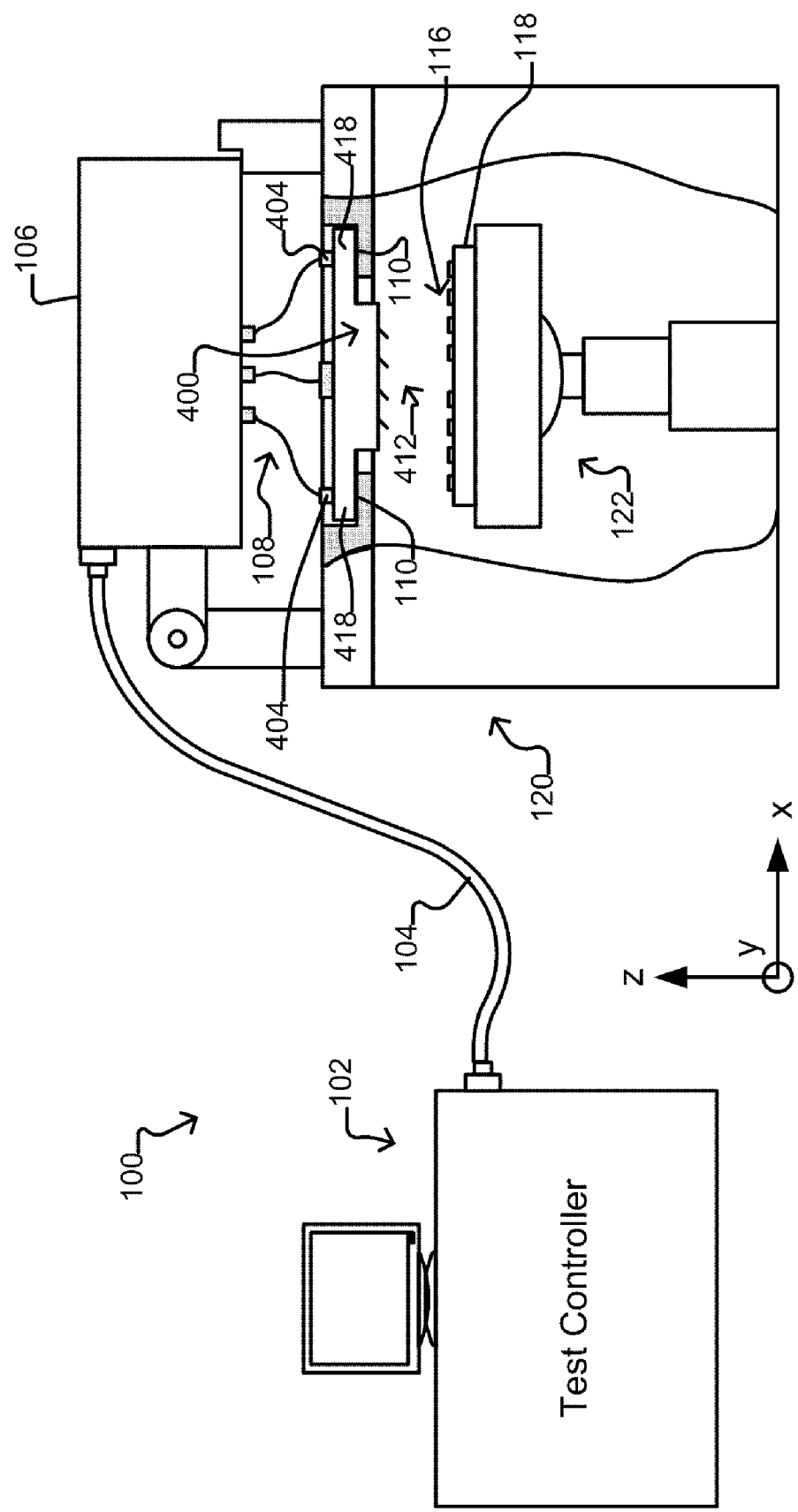
FIG. 33 illustrates the test system of FIG. 1 with the probe card assembly of FIG. 4 according to some embodiments of the invention.

Referring now to the process 3200 of FIG. 32, at 3202, the probe card assembly 112 can be coupled to the mounting surface 110 of the housing 120 in the test system 100 of FIG. 1. For example, as illustrated in FIG. 33 (which shows the test system 100 of FIG. 1 but with the probe card assembly 400, including any embodiment or modification of the probe card assembly 400 discuss herein, in place of the probe card assembly 112) the coupling arms 418 of the probe card assembly 400 of FIGS. 4 and 5 can be coupled by the second adjustable coupling mechanisms 508 (not shown in FIG. 33 but shown in FIGS. 4, 5, 6A, and 6B) to the mounting surface 110. Alternatively, the arms 418 can be coupled to the mounting surface 110 by other mechanisms. For example, the arms 418 can be bolted, clamped, etc. to the mounting surface 110. As also shown in FIG. 33, the electrical connectors 404 of the probe card assembly 400 can be electrically connected to the connectors 108. The probe card assembly 400 can thus be communicatively connected to the test controller 102 through the connectors 108, test head 106, and connection 104.

At 3204 in the process 3200 of FIG. 32, the orientation of the frame 408 can be adjusted by the first adjustable coupling mechanisms 502. For example, the first adjustable coupling mechanisms 502 (including any embodiment of the first adjustable coupling mechanism described herein) can be used to adjust the tilt of the frame 408 with respect to the stiffener 402 and/or the shape of the major surface 534 of the frame 408 as shown in FIGS. 7 and 8. Alternatively or in addition, the tilt of the stiffener 402 can be adjusted with respect to the mounting surface 110 of the housing 120 of the test system 100 of FIG. 33, for example, using the second adjustable coupling mechanisms 508 (including any embodiment of the second adjustable coupling mechanism described herein) as shown in FIG. 10. The foregoing can be done to conform the orientation of contact portions of the probes 412 to an orientation of the terminals 116 of the DUTs 118 (see FIG. 33).

At 3206 of the process 3200 of FIG. 32, terminals 116 of the DUTs 118 in FIG. 33 can be brought into contact with the probes 412 of the probe card assembly 400. This can be accomplished by moving the chuck 122 such that terminals 116 of the DUTs 118 are pressed against probes 412 of the probe card assembly 400. Alternatively, the probe card assembly 400 can be moved, or both the chuck 122 and the probe card assembly 400 can be moved to effect contact between the terminals 116 and the probes 412.

At 3208, test signals (which, as discussed above, can include input signals generated by the test controller 102, and response signals generated by the DUTs 118 in response to the input signals) can be passed between the test controller 102 and the DUTs 118 through the probe card assembly 400. The test controller 102 can analyze the response signals to determine whether the DUTs 118 pass the testing. For example, the test controller 102 can compare the response signals to expected response signals. If the response signals match the expected response signals, the test controller 102 can determine that the DUTs 118 passed the testing. Otherwise, the test controller 102 can determine that the DUTs 118 failed the testing. As another example, the test controller 102 can determine whether the response signals are within acceptable ranges, and if so, can determine that the DUTs 118 passed the testing.

During 3208 in the process 3200 of FIG. 32, one or more of the substrates of the probe card assembly can be allowed to move (e.g., expand or contract) in the "x,y" plane relative to one or more of the other substrates while maintaining stiffness in the "z" direction. As discussed above, the first adjustable coupling mechanisms 502 can allow the stiffener 402 and the frame 408 to expand and contract in the "x,y" plane with respect to each other and thus avoid warping like the warping illustrated in FIG. 3 even if the stiffener 402 and the frame 408 expand or contract differently. Also as discussed above, the non-adjustably fixed coupling mechanisms 506 can similarly allow the frame 408 and each probe assembly 414 and to expand and contract in the "x,y" plane with respect to each other, and the second adjustable coupling mechanisms 508 can allow the stiffener 402 and the mounting surface 110 in FIG. 33 to expand and contract in the "x,y" plane with respect to each other. This can also avoid warping like the warping illustrated in FIG. 3 even if the frame 408 and one or more of the probe substrates 410 expand or contact differently or the stiffener 402 and the mounting surface 110 expand or contact differently. Moreover, as discussed above, the first adjustable coupling mechanisms 502, the non-adjustably fixed coupling mechanisms 506, and the second adjustable coupling mechanisms 508 can do so while maintaining stiffness in the "z" direction. Thus, the first adjustable coupling mechanisms 502, the non-adjustably fixed coupling mechanisms 506, and the second adjustable coupling mechanisms 508 can impede relative movement in the "z" direction among the mounting surface 110, the stiffener 402, the frame 408, and the probe substrates 410.

It is also noted that, during 3208 of the process 3200 of FIG. 32, the coupling mechanisms 504 can allow the wiring substrate 406 to expand and contract radially in the "x,y" plane from the location 2404 of the terminals 514 on the wiring substrate 406 and the location 2512 of the spring interconnects 526 of the interposers 518 while the interposers 518 are positioned against bumps 2520 in the openings 516 in the frame 408. Moreover, the coupling mechanisms 504 can do so while keeping the locations 2404 and 2512—and thus the terminals 514 on the wiring substrate 406 and the location 2512 of the spring interconnects 526 of the interposers 518—aligned. Thus, this can not only avoid the warping shown in FIG. 3 but can keep the spring interconnects 526 and 528 aligned with the terminals 514 on the wiring substrate 406 and the terminals 520 on the probe substrates 410.

Although not shown in the Figures, the frame 408 can be made to have the same or similar thermal strain as the DUTs 118 (see FIG. 33). This can keep probes 412 aligned with the terminals 116 of the DUTs 118 even as the DUTs expand or contract during testing. The thermal strain of the DUTs 118 is as follows: $CTE_{DUTs} * \Delta T_{DUTs}$, where $CTE_{DUTs}$ is the coefficient of thermal expansion of the DUTs 118, *means multiplication, and $\Delta T_{DUTs}$ is the difference between the actual temperature of the DUTs 118 at any given time during use of the probe card assembly 400 and a reference temperature. As discussed above, the thermal strain of the frame 408 is as follows: $CTE_{frame} * \Delta T_{frame}$, where $CTE_{frame}$ is the coefficient of thermal expansion of the frame 408; * means multiplication, and $\Delta T_{frame}$ is the difference between the actual temperature of the frame 408 at any given time during use of the probe card assembly 400 and a reference temperature. In practice, the probe card assembly 400—and in particular the frame 408—can be configured such that the probes 412 align with the terminals 116 of the DUT 118 at a reference temperature, and thereafter the thermal strain of the DUTs 118 and the thermal strain of the frame 408 can be made equal or approximately equal by selecting the material of the frame 408 to obtain a particular coefficient of thermal expansion for the frame 1310, and alternatively or in addition, controlling the temperature of the frame 408 during testing of the DUTs 118 so that the thermal strain of the frame 408 equals or approximately equals the thermal strain of the DUTs 118 over the range of temperatures of the frame 408 and the DUT 118 during testing of the DUT 118. As discussed above, the temperature of the frame 408 can be controlled by including one or more temperature control devices in the probe card assembly 400. For example, a band heater 416, as shown in FIGS. 4 and 5 can be disposed around the frame 408 and controlled during use of the probe card assembly 400 to control the temperature of the frame 408.

Figure 34:
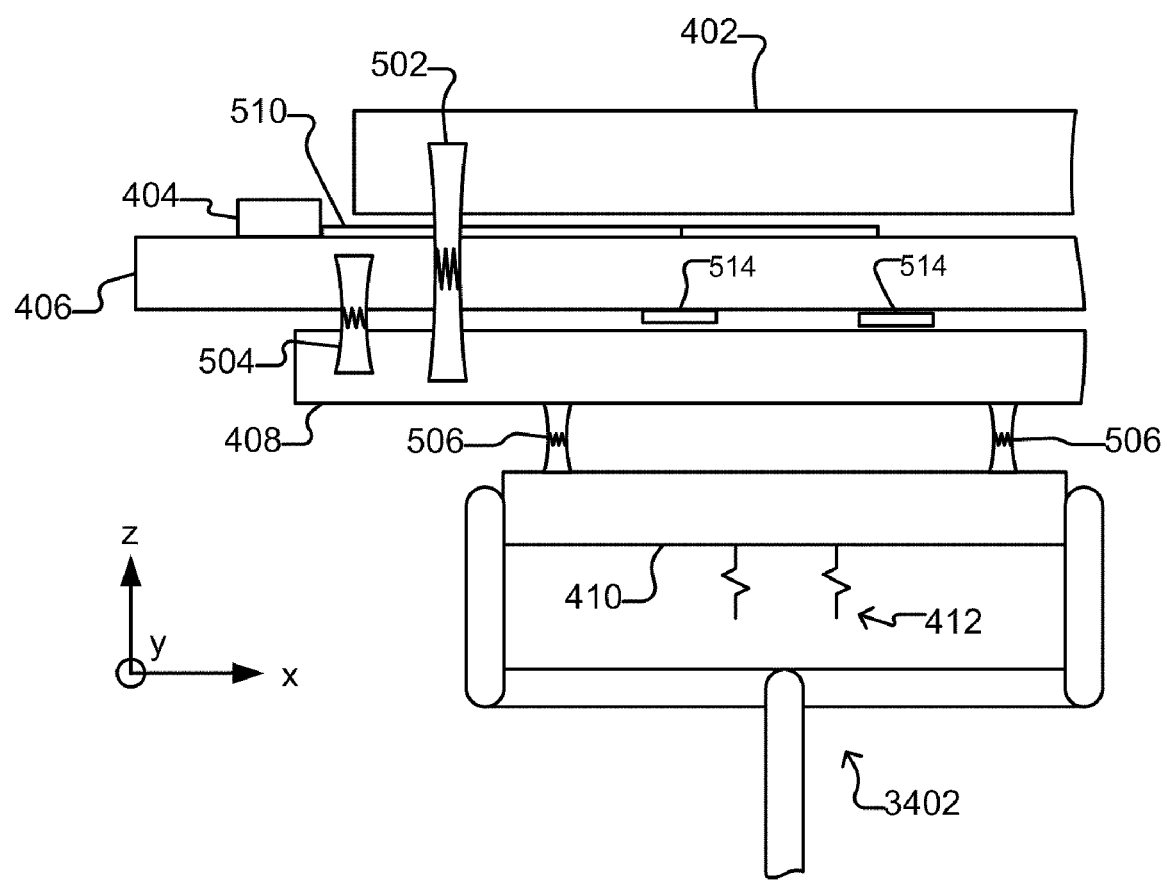
FIG. 34 illustrates a process for making the probe card assembly of FIG. 4 according to some embodiments of the invention.

FIG. 34 illustrates a process of making the probe card assembly 400 according to some embodiments of the invention. A stack comprising the stiffener 402 and the frame 408 coupled by the first adjustable coupling mechanisms 502 (including any example, embodiment, configuration, or variation disclosed herein) and the wiring substrate 406 coupled to the frame 408 with coupling mechanisms 504 (including any example, embodiment, configuration, or variation disclosed herein) can be assembled, made, provided, or obtained. Although not shown in FIG. 34, the interposers 518 can be in the openings 516 in the frame 408 as shown in FIGS. 5 and 6A. Alternatively, the interposers 518 can be placed in the openings 516 in the frame 408 later.

The non-adjustably fixed coupling mechanisms 506 (including any example, embodiment, configuration, or variation disclosed herein) can be positioned with respect to the frame 408. For example, if the non-adjustably fixed coupling mechanisms 506 comprise the pins 1510 of FIG. 15, the pins 1510 can be inserted into the holes 1502 in the frame 408 (see FIG. 15). A probe substrate 410 can be moved into a desired position with respect to the frame 408 as shown in FIG. 34. The position of the probe substrate 410 can be adjusted in the "x,y" plane and/or the "z" direction as needed so that the probe substrate 410 is in a desired position. In some embodiments, a pick and place machine 3402 can be used to position the probe substrate 410. With the probe substrate 410 in the desired position, the non-adjustably fixed coupling mechanisms 506 can be joined to the frame 408 and to the probe substrate 410. For example, if the non-adjustably fixed coupling mechanisms 506 comprise the pins 1510 of FIG. 15, the pins 1510 can be joined to the holes 1502 by joining material 1504 and to the probe substrate 410 by joining material 1512.

We claim:

1. A probe card assembly for testing electronic devices comprising:
    a stiffener structure, a wiring substrate, and a frame having a major surface disposed in a stack, wherein the wiring substrate is disposed between the frame and the stiffener structure;
    a plurality of probe substrates each having probes that are electrically connected through the probe card assembly to an electrical interface on the wiring substrate to a test controller; and
    one or more non-adjustably fixed coupling mechanisms, each non-adjustably fixed coupling mechanism fixing one or more of the probe substrates to the frame, the non-adjustably fixed coupling mechanisms being simultaneously stiff in a first direction perpendicular to the major surface and flexible in a second direction generally parallel to the major surface.

2. The probe card assembly of claim 1, further comprising:
    a plurality of adjustable coupling mechanisms coupling the stiffener structure and the frame, the adjustable coupling mechanisms being simultaneously stiff in the first direction and flexible in a the second direction.

3. The probe card assembly of claim 2, wherein:
    a stiffness of the adjustable coupling mechanisms substantially impedes relative movement between the stiffener structure and the frame in the first direction, and a flexibility of the first adjustable coupling mechanisms allows relative movement between the stiffener structure and the frame in the second directions; and
    a stiffness of the non-adjustably fixed coupling mechanisms substantially impedes relative movement between each of the probe substrates and the frame in the first direction, and a flexibility of the non-adjustably fixed coupling mechanisms allows relative movement between each of the probe substrates and the frame in the second direction.

4. The probe card assembly of claim 2, wherein:
    the stiffener structure is disposed on a first side of the wiring substrate to stiffen the wiring substrate in the first direction, and
    the frame is a second stiffening structure disposed on a second side of the wiring substrate to stiffen the wiring substrate in the first direction and/or support the probe substrates.

5. The probe card assembly of claim 4, wherein the stiffener structure comprises a mounting mechanism by which the probe card assembly is coupled to and decoupled from a test system at a mounting surface.

6. The probe card assembly of claim 5, wherein the mounting mechanism comprises one or more structures being simultaneously stiff in a direction perpendicular to the mounting surface and flexible in a direction generally parallel to the mounting surface.

7. The probe card assembly of claim 4, wherein:
    each of the non-adjustably fixed coupling mechanisms comprises an elongate pin,
    a length of the pin is oriented generally in the first direction,
    a first end portion of the pin is non-adjustably coupled to the frame, and
    a second end of the pin is coupled to one or more of the probe substrates.

8. The probe card assembly of claim 7, wherein:
    the first end portion of the pin is coupled by a first joining material to the frame, and
    the second end of the pin is coupled by a second joining material to the one or more of the probe substrates.

9. The probe card assembly of claim 8, wherein the first joining material and the second joining material each comprise solder, brazing material, an adhesive, nano-particles, or welding material.

10. The probe card assembly of claim 7, wherein the second end is coupled to a hole in the one of the probe substrates.

11. The probe card assembly of claim 4, wherein each of the non-adjustably fixed coupling mechanisms comprises an L bracket.

12. The probe card assembly of claim 4, wherein each of the adjustable coupling mechanisms comprises a structural member secured at a first end to the stiffener structure, a section of the structural member extending from the first end through an oversized opening in the stiffener structure and an oversized opening in the wiring substrate to a second end that is secured to the frame.

13. The probe card assembly of claim 1 further comprising coupling mechanisms coupling the wiring substrate to the frame and allowing thermal expansion or contraction of the wiring substrate from a location while maintaining alignment between terminals on the wiring substrate and spring interconnects of interposers disposed in openings in the frame and electrically connecting the terminals on the wiring substrate to terminals on the probe substrates.

14. The probe card assembly of claim 13, wherein each of the coupling mechanisms comprises:
an alignment feature extending from one of the wiring substrate or the frame, and
a slot in the other of the wiring substrate or the frame and flexures adjacent the slot,
wherein the flexures flex while the alignment feature is inserted into the slot.

15. The probe card assembly of claim 13, wherein:
the frame comprises a plurality of openings,
the probe card assembly further comprises a plurality of interposers, each of the interposers disposed in one of the openings and electrically connecting terminals on the second side of the wiring substrate with terminals on a first side of at least one of the probe substrates, the terminals on the second side of the wiring substrate electrically connected through the wiring substrate to the interface to the test controller, the terminals on the first side of the at least one of the probe substrates electrically connected through the probe substrate to the probes on the probe substrate.

16. The probe card assembly of claim 15, wherein each of the interposers comprises flexible electrical conductors extending from opposite sides of an interposer body, the flexible electrical conductors in contact with the terminals on the second side of the wiring substrate and terminals on the first side of the at least one of the probe substrates.

17. The probe card assembly of claim 16, wherein the interposer body comprises a first part and a second part that are moveable with respect to each other in the parallel directions.

18. The probe card assembly of claim 1 further comprising a temperature control device in contact with the frame.

19. The probe card assembly of claim 1 further comprising coupling mechanisms for mounting the probe card assembly to a mounting surface of a housing wherein the coupling mechanisms are substantially stiff in a direction that is perpendicular to the mounting surface and simultaneously flexible in a direction that is parallel to the mounting surface.

* * * * *